United States Patent
Kuroki

(10) Patent No.: US 9,680,129 B2
(45) Date of Patent: Jun. 13, 2017

(54) METHOD FOR MANUFACTURING ORGANIC LIGHT EMITTING ELEMENT INCLUDING LIGHT EXTRACTING LAYER FORMED BY IRRADIATING COATING SOLUTION

(71) Applicant: Konica Minolta, Inc., Chiyoda-ku, Tokyo (JP)

(72) Inventor: Takaaki Kuroki, Hachioji (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/769,682

(22) PCT Filed: Feb. 20, 2014

(86) PCT No.: PCT/JP2014/054015
§ 371 (c)(1),
(2) Date: Aug. 21, 2015

(87) PCT Pub. No.: WO2014/129536
PCT Pub. Date: Aug. 28, 2014

(65) Prior Publication Data
US 2016/0020429 A1   Jan. 21, 2016

(30) Foreign Application Priority Data
Feb. 22, 2013   (JP) .................. 2013-033199

(51) Int. Cl.
*H01L 29/08*   (2006.01)
*H01L 51/52*   (2006.01)
(Continued)

(52) U.S. Cl.
CPC .......... *H01L 51/5268* (2013.01); *C09K 11/06* (2013.01); *H01L 51/5275* (2013.01);
(Continued)

(58) Field of Classification Search
CPC . H01L 51/5268; H01L 51/5275; H01L 51/56; C09K 2211/185
See application file for complete search history.

(56) References Cited

U.S. PATENT DOCUMENTS

2011/0017987 A1* 1/2011 Naito .................. C09K 11/06
257/40

FOREIGN PATENT DOCUMENTS

| JP | 2931211 B2 | 8/1999 |
|---|---|---|
| JP | 2004020746 A | 1/2004 |

(Continued)

OTHER PUBLICATIONS

International Preliminary Report on Patentability corresponding to Application No. PCT/JP2014/054015; Date of Mailing: Aug. 25, 2015, with English translation.
(Continued)

*Primary Examiner* — Matthew Gordon
(74) *Attorney, Agent, or Firm* — Cantor Colburn LLP

(57) ABSTRACT

A method of manufacturing an organic light emitting element equipped with a transparent substrate, an internal light extracting layer, and a transparent metal electrode includes: forming the internal light extracting layer on the transparent substrate, and forming the transparent metal electrode on the internal light extracting layer. The step of forming the internal light extracting layer includes: applying a coating solution onto the transparent substrate into a predetermined pattern, the coating solution containing a light scattering particle having an average particle size of 0.2 μm or more and less than 1 μm and a refractive index of 1.7 or more and less than 3.0 and a hydroxy-containing solvent, and drying the applied patterned coating solution through irradiation with infrared light having a proportion of 5% or less of a
(Continued)

spectral radiance at a wavelength of 5.8 μm to a spectral radiance at a wavelength of 3.0 μm.

6 Claims, 13 Drawing Sheets

(51) Int. Cl.
  *C09K 11/06* (2006.01)
  *H01L 51/56* (2006.01)

(52) U.S. Cl.
  CPC ........ *H01L 51/56* (2013.01); *C09K 2211/185* (2013.01); *H01L 2251/5369* (2013.01); *H01L 2251/55* (2013.01)

(56) References Cited

FOREIGN PATENT DOCUMENTS

| JP | 2008016348 A | | 1/2008 |
|---|---|---|---|
| JP | 2009004275 A | * | 1/2009 |
| JP | 2010170969 A | | 8/2010 |
| JP | 2012089313 A | | 5/2012 |

OTHER PUBLICATIONS

Written Opinion of the International Searching Authority corresponding to Application No. PCT/JP2014/054015; Date of Mailing: May 13, 2014.

International Search Report corresponding to Application No. PCT/JP2014/054015; Date of Mailing: May 13, 2014, with English translation.

* cited by examiner

T/D=150/250=0.6

SMOOTHING LAYER

LIGHT SCATTERING LAYER

T/D=1000/250=4

T/D=200/250=0.8

SMOOTHING LAYER

LIGHT SCATTERING LAYER

T/D=300/250=1.2

LIGHT SCATTERING LAYER    SMOOTHING LAYER

T/D=500/250=2

SMOOTHING LAYER

LIGHTS CATTERING LAYER

LESS THAN 30%

| | |
|---|---|
| AVERAGE SURFACE ROUGHNESS [Ra] | :1.398E + 00 nm |
| MAXIMUM DIFFERENCE IN HEIGHT [P-V] | :1.669E + 01 nm |
| HIGHEST PEAK [Rp] | :7.200E + 00 nm |
| LOWEST VALLEY [Rv] | :-9.494E + 00 nm |
| ROOT MEAN SQUARED SURFACE ROUGHNESS [RMS] | :1.788E + 00 nm |
| N-POINT AVERAGE ROUGHNESS [Rz] | :1.023E + 01 nm [10 Points] |
| SURFACE AREA [S] | :9.972E + 07 nm$^2$ |
| SURFACE AREA RATIO [S ratio] | :1.001E + 00 |

"PRIOR ART"

METHOD FOR MANUFACTURING ORGANIC LIGHT EMITTING ELEMENT INCLUDING LIGHT EXTRACTING LAYER FORMED BY IRRADIATING COATING SOLUTION

CROSS REFERENCE TO RELATED APPLICATIONS

This is the U.S. national stage of application No. PCT/JP2014/054015, filed on Feb. 20, 2014. Priority under 35 U.S.C. §119(a) and 35 U.S.C. §365(b) is claimed from Japanese Application No. 2013-033199 filed on Feb. 22, 2013, the disclosure of which is also incorporated herein by reference.

TECHNICAL FIELD

The present invention relates to methods for manufacturing organic light emitting elements, and organic light emitting elements, and in particular, relates to a method for manufacturing organic light emitting elements which is suitably used in mass production of organic light emitting elements having enhanced luminescence efficiency and durability, and organic light emitting elements manufactured by the method.

BACKGROUND ART

Organic light emitting elements have come to attention as thin luminous materials.

Organic light emitting elements utilizing electroluminescence (EL) of organic materials (the so-called organic EL elements) are completely solid elements in the form of a thin film which can emit light at low voltage of about several volts to several tens of volts. These organic light emitting elements have many excellent characteristics, such as high luminance, high luminescent efficiency, thinness, and lightness in weight. These characteristics of the organic light emitting elements receive attention in applications to backlights for a variety of displays and planar luminous elements, e.g., light sources for illumination used in display boards, such as signs and emergency lights.

A typical organic light emitting element includes two electrodes and a luminous layer composed of an organic material and disposed between the electrodes, through which luminescent light generated in the luminous layer is extracted to the outside. At least one of the two electrodes should be transparent to extract the luminescent light.

The organic light emitting elements can generate light with high luminance at low electricity, and are advantageous in high visibility, high response rate, prolonged service life, and low power consumption. Unfortunately, the use efficiency of the light generated in the organic light emitting element is at most 20%, which indicates significant loss of the luminescent light inside the element.

FIG. 19 is a schematic sectional view showing a conventional organic light emitting element.

An organic light emitting element 100 includes a metal electrode 101, an organic luminous layer 102 having a refractive index of about 1.8, a transparent electrode 103 having a refractive index of about 1.8, and a transparent substrate 104 having a refractive index of about 1.5, which are sequentially laminated from a lower layer in the drawing. In the drawing, the arrows 110a to 110e indicate characteristic light components of the light generated in the organic luminous layer 102.

The light component 110a is perpendicular to the organic luminous layer 102 as a light emitting surface, and is extracted through the transparent substrate 104 from a light-emitting side (to the air).

The light component 110b is incident on the interface between the transparent substrate 104 and the air at the critical angle or less, and inflects at the interface between the transparent substrate 104 and the air to be extracted from the light-emitting side.

The light component 110c is incident on the interface between the transparent substrate 104 and the air at an angle larger than the critical angle. The light component 110c is totally reflected at the interface between the transparent substrate 104 and the air, and cannot be extracted from the light-emitting side. This loss due to total reflection of the light is referred to as "substrate loss," which is typically about 20%.

The light component 110d is incident on the interface between the transparent electrode 103 and the transparent substrate 104 at an angle larger than the critical angle and satisfies the resonant condition. Such a light component 110d is totally reflected at the interface between the transparent electrode 103 and the transparent substrate 104 to generate a waveguide mode, in which the light component is confined within the organic luminous layer 102 and the transparent electrode 103. This loss due to the waveguide mode is referred to as "waveguide loss," which is typically about 20 to 25%.

The light component 110e is incident on the metal electrode 101, and reacts with free electrons in the metal electrode 101 to generate a plasmon mode, one of the waveguide modes, in which the light component is confined near the surface of the metal electrode 101. This loss due to the plasmon mode is referred to as "plasmon loss," which is typically about 30 to 40%.

As described above, the conventional organic light emitting element 100 has substrate loss, waveguide loss, and plasmon loss; hence, light emitting elements are faced with the task of emission of a larger amount of light by reduced extraction loss.

For example, PTL 1 discloses an organic electroluminescent (EL) device including a light scattering unit composed of a lens sheet and disposed adjacent to a light extraction surface.

PTL 2 discloses a substrate for a light emitting device disposed on the light emitting surface of a light emitting device, the substrate including an irregular layer having a high refractive index of 1.6 or more and an average surface roughness of 10 nm or more on at least one of surfaces of the substrate and one or more substrate layers having a refractive index of 1.55 or more, and a light emitting device.

Irrespective of the problems described above, the organic light emitting elements have an advantage over the conventional light emitting elements, that is, planar light emission from a thin film To utilize this advantageous feature, the organic light emitting elements should be formed on flexible transparent substrates (supports). To meet such a requirement, an enhancement in heat resistance of flexible transparent substrates has been examined, and there is still a great demand for techniques of forming high-quality organic light emitting elements on flexible transparent substrates, such as PET films, that have been extensively used in the market.

Unfortunately, these transparent substrates have low heat resistance, and desired techniques are yet to be developed due to technical difficulties. Although internal light extraction (waveguide-mode light) structures have come into focus in enhancing the luminescence efficiency and the durability of the organic light emitting elements, materials and processes should be still developed to achieve high performance of organic light emitting elements formed on flexible transparent substrates having low heat resistance, such as PET films.

CITATION LIST

Patent Literature

PTL 1: Japanese Patent No. 2931211
PTL 2: Japanese Patent Application Laid-Open Publication No. 2004-20746

SUMMARY OF INVENTION

Problems to be Solved by Invention

An object of the present invention, which has been made in consideration of the problems and circumstances described above, is to provide a method of manufacturing an organic light emitting element suitable for mass production of organic light emitting elements having enhanced luminescence efficiency and durability, and an organic light emitting element manufactured by the method.

Means for Solving Problems

The above problems can be solved by the following method according to the present invention.

In particular, the method of manufacturing an organic light emitting element according to the present invention can achieve the object of the present invention by forming an internal light extracting layer (light scattering layer and smoothing layer) having a specific composition by the process according to the present invention. The present inventor has reviewed the process according to the present invention as a process of forming a light scattering layer and a smoothing layer at low temperature and a high production rate, and has conducted extensive research. The inventor has found that, compared to the conventional heat drying process, the outcoupling efficiency and the durability of the organic light emitting element are more significantly enhanced by a combination of the formulation according to the present invention, particularly an ink formulation containing a hydroxy (—OH)-containing solvent with a drying step through irradiation with infrared light.

Although the function and the mechanism are not clarified, the present inventor presumes high miscibility and compatibility of the hydroxy-containing solvent with light scattering particles and a binder. The present inventor also presumes that the solvent instantly vaporizes or volatilizes when the solvent absorbs the infrared light, unlike volatilization caused by convection during drying by heat transfer. This instantaneous volatilization of the solvent seems to contribute to an enhancement in fine characteristics of the light scattering layer and the smoothing layer, such as crystallinity and layer density, resulting in enhanced outcoupling efficiency.

The present inventor has also found that if the layer is irradiated with short-wavelength light (ultraviolet light or electron beams) after the irradiation with infrared light, not only the strength of the layer but also the outcoupling efficiency and the durability of the organic light emitting element can be enhanced by an ink formulation containing a photocurable binder, and has achieved the present invention.

Although the mechanism of curing by irradiation with short-wavelength light (ultraviolet light or electron beams) is not clarified, the present inventor believes that the layer density may be enhanced by an effect of the photocurable binder cured and contracted to bring high-refractive index particles within the network of the binder close to each other on the order of angstrom.

Furthermore, irradiation with light from a preferred excimer light source provides high reaction efficiency unique to high energy (E) beams and actions, such as discoloring of coloring components. Such complex reactions seem to contribute to an enhancement in the performance of the light scattering layer and the smoothing layer.

The formulation and the method according to the present invention can attain Mie scattering internal light extraction structures at low temperature, although such structures have been necessarily produced through a process at high temperature. This technique using the formulation and the method according to the present invention is also applicable to organic EL elements including flexible substrates (flexible transparent substrates) in the future. Patterning techniques are important in application of this technique to organic EL elements including flexible substrates, and inkjet (IJ) patterning is most preferred in view of applicability to production.

The present inventor has confirmed that a combination of formulation and the method according to the present invention can achieve an organic light emitting element (OLED) with high efficiency including a flexible substrate and an internal scattering outcoupling layer disposed thereon, and has achieved the present invention.

1. A method of manufacturing an organic light emitting element including a transparent substrate, an internal light extracting layer, and a transparent metal electrode, the method including:

forming the internal light extracting layer on the transparent substrate, and forming the transparent metal electrode on the internal light extracting layer, wherein the step of forming the internal light extracting layer includes:

applying a coating solution onto the transparent substrate into a predetermined pattern, the coating solution containing a light scattering particle having an average particle size of 0.2 µm or more and less than 1 µm and a refractive index of 1.7 or more and less than 3.0 and a hydroxy-containing solvent, and drying the applied patterned coating solution through irradiation with infrared light having a proportion of 5% or less of a spectral radiance at a wavelength of 5.8 µm to a spectral radiance at a wavelength of 3.0 µm.

2. The method of manufacturing the organic light emitting element of item 1., wherein the step of forming the internal light extracting layer includes irradiating the dried coating solution with ultraviolet light or an electron beam to cure the dried coating solution.

3. The method of manufacturing the organic light emitting element of item 2., wherein in the step of curing the coating solution, the ultraviolet light is excimer light having a wavelength of 150 nm to 230 nm.

4. The method of manufacturing the organic light emitting element of any one of items 1. to 3., wherein in the step of applying the coating solution into the predetermined pattern, the coating solution is applied into the predetermined pattern by an inkjet process.

5. The method of manufacturing the organic light emitting element of any one of items 1. to 4., further including:

forming an organic functional layer on the transparent metal electrode, wherein in the step of forming the organic functional layer, the organic functional layer is formed in a position to overlap with the internal light extracting layer in plan view.

6. The method of manufacturing the organic light emitting element of any one of items 1. to 5., wherein in the step of forming the internal light extracting layer, the internal light extracting layer is formed on the transparent substrate by a roll-to-roll process in a midway between a feed roll and a take-up roll while the transparent substrate unwound from the feed roll is being wound around the take-up roll.

7. An organic light emitting element including: a transparent substrate, an internal light extracting layer, and a transparent metal electrode, wherein the internal light extracting layer includes a light scattering layer and a smoothing layer disposed in this order on the transparent substrate, the light scattering layer contains a light scattering particle having an average particle size of 0.2 μm or more and less than 1 μm and a refractive index of 1.7 or more and less than 3.0, and the internal light extracting layer has (i) a refractive index of 1.7 or more and less than 2.5, (ii) an absorbance of less than 15% with respect to light having a wavelength within the range of 450 to 700 nm, and (iii) a haze value of 30% or more.

8. An organic light emitting element including: a transparent substrate, an internal light extracting layer, and a transparent metal electrode, wherein the internal light extracting layer includes a light scattering layer and a smoothing layer disposed in this order on the transparent substrate, the internal light extracting layer is formed by applying a coating solution onto the transparent substrate, the coating solution containing a light scattering particle having an average particle size of 0.2 μm or more and less than 1 μm and a refractive index of 1.7 or more and less than 3.0 and a hydroxy-containing solvent, and drying the coating solution through irradiation with infrared light having a proportion of 5% or less of a spectral radiance at a wavelength of 5.8 μm to a spectral radiance at a wavelength of 3.0 μm, and the internal light extracting layer has (i) a refractive index of 1.7 or more and less than 2.5, (ii) an absorbance of less than 15% with respect to light having a wavelength within the range of 450 to 700 nm, and (iii) a haze value of 30% or more.

9. The organic light emitting element of item 7. or 8., wherein the transparent substrate includes a flexible transparent substrate and one or more bather layers having a refractive index of 1.4 to 1.7.

10. The organic light emitting element of any one of items 7. to 9., wherein T/D is 0.75 to 3.0 where a thickness of the light scattering layer is T and the average particle size of the light scattering particle contained in the light scattering layer is D.

11. The organic light emitting element of any one of items 7. to 10., wherein the light scattering particle is contained in the light scattering layer in an in-plane occupancy rate of 30% or more.

Effects of Invention

The present invention can provide a method of manufacturing an organic light emitting element which is suitable for mass production of organic light emitting elements having enhanced luminescence efficiency and durability, and an organic light emitting element manufactured by the method.

MODES FOR CARRYING OUT THE INVENTION

Figure 1:
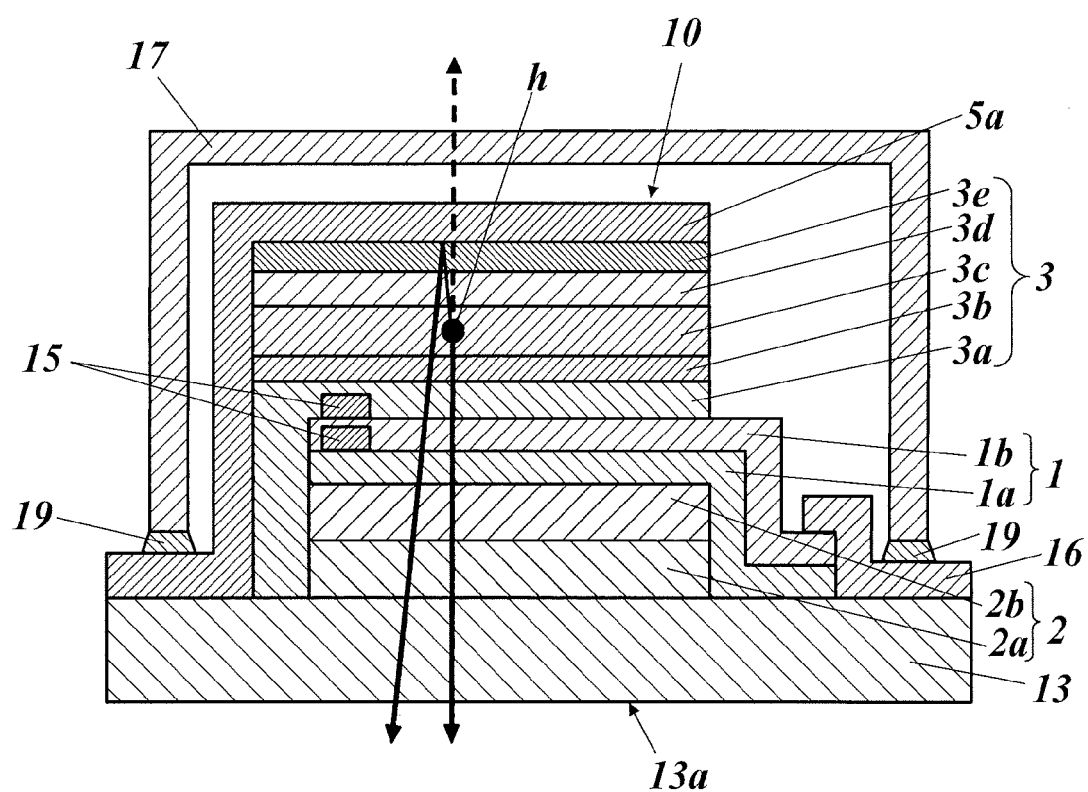
FIG. 1 is a sectional view showing a schematic configuration of an organic light emitting element.

The present invention is basically characterized by a method of manufacturing an organic light emitting element including a transparent substrate, an internal light extracting layer, and a transparent metal electrode, the methods including:

forming the internal light extracting layer on the transparent substrate, and forming the transparent metal electrode on the internal light extracting layer, wherein the step of forming the internal light extracting layer includes:

applying a coating solution onto the transparent substrate into a predetermined pattern, the coating solution containing a light scattering particle having an average particle size of 0.2 μm or more and less than 1 μm and a refractive index of 1.7 or more and less than 3.0 and a hydroxy-containing solvent; and drying the applied patterned coating solution through irradiation with infrared light having a proportion of 5% or less of a spectral radiance at a wavelength of 5.8 μm to a spectral radiance at a wavelength of 3.0 μm.

Such a method can mass-produce organic light emitting elements having enhanced luminescence efficiency and durability.

Preferably, the step of forming the internal light extracting layer further includes irradiating the dried coating solution with ultraviolet light or an electron beam(s) to cure the dried coating solution.

The step of curing the coating solution seems to increase the layer density of the internal light extracting layer, enhancing the outcoupling efficiency and the durability of the organic light emitting element.

In the step of curing the coating solution, the ultraviolet light is preferably excimer light having a wavelength of 150 nm to 230 nm.

In the step of applying the coating solution into the predetermined pattern, the coating solution is preferably applied into a predetermined pattern by an inkjet method not using any printing plate, in place of a printing method using a printing plate.

The method of manufacturing an organic light emitting element further includes forming an organic functional layer on the transparent metal electrode, wherein in the step of forming the organic functional layer, the organic functional layer is preferably formed in a position to overlap with the internal light extracting layer in plan view.

Such a configuration enables effective extraction of the luminescent light generated in the organic functional layer through the internal light extracting layer.

In the step of forming the internal light extracting layer, it is preferable that the internal light extracting layer be formed on the transparent substrate by a roll-to-roll process in a midway between a feed roll and a take-up roll while the transparent substrate unwound from the feed roll is being wound around the take-up roll.

The roll-to-roll process can mass-produce organic light emitting elements.

The present invention, its constituent elements, and embodiments and aspects for implementing the present invention will now be described in detail.

Throughout the specification, the tem "to" between numeric values indicates that the numeric values before and after the tem are inclusive as the lower limit and the upper limit, respectively.

<Organic Light Emitting Element 10>

As shown in FIG. 1, the organic light emitting element 10 according to the present invention is disposed on a transparent substrate 13. The organic light emitting element 10 includes a transparent substrate 13, an internal light extracting layer 2, a transparent metal electrode 1, a luminous functional layer 3 composed of an organic material, etc., and a counter electrode 5a, disposed in this order. An extraction electrode 16 is provided at one end of the transparent metal electrode 1 (electrode layer 1b). The transparent metal electrode 1 is electrically connected to an external power supply (not shown) through the extraction electrode 16. The organic light emitting element 10 is configured such that generated light (luminescent light h) is extracted at least from the transparent substrate 13.

The organic light emitting element 10 may have any layer structure, for example, a typical layer structure. Throughout the specification, the transparent metal electrode 1 functions as an anode and the counter electrode 5a functions as a cathode. In this case, an exemplary configuration of the luminous functional layer 3 includes a hole injecting layer 3a, a hole transporting layer 3b, a luminous layer 3c, an electron transporting layer 3d, and an electron injecting layer 3e, sequentially disposed on the transparent metal electrode 1 as an anode. The luminous functional layer 3 should have at least the luminous layer 3c composed of at least an organic material among these layers. The hole injecting layer 3a and the hole transporting layer 3b may be disposed as a hole transporting injecting layer. The electron transporting layer 3d and the electron injecting layer 3e may be disposed as an electron transporting injecting layer. In the luminous functional layer 3, for example, the electron injecting layer 3e may be composed of an inorganic material.

The luminous functional layer 3 may include a hole blocking layer and/or an electron blocking layer disposed in required places if necessary. The luminous layer 3c may include luminous sublayers of different colors generating luminescent lights in the corresponding wavelength regions. These luminous sublayers of different colors and a non-luminous intermediate sublayer may be laminated with the non-luminous intermediate sublayer interposed between the luminous sublayers. The intermediate sublayer may function as a hole blocking layer or an electron blocking layer. The counter electrode or cathode 5a may have a laminate structure if necessary. In such a laminate configuration, only the luminous functional layer 3 interposed between the transparent metal electrode 1 and the counter electrode 5a corresponds to the light emission region of the organic light emitting element 10.

In such a layer configuration, an auxiliary electrode 15 may be disposed on the electrode layer 1b of the transparent metal electrode 1 to reduce the resistance of the transparent metal electrode 1.

The organic light emitting element 10 having such a configuration is sealed with a sealing material 17 described later, which is disposed over the transparent substrate 13 to prevent degradation of the luminous functional layer 3 composed of an organic material, etc. The sealing material 17 is fixed to the transparent substrate 13 with an adhesive 19. The terminals of the transparent metal electrode 1 (extraction electrode 16) and the counter electrode 5a are kept insulated on the transparent substrate 13 by the interposed luminous functional layer 3, and are exposed from the sealing material 17.

The main layers forming the organic light emitting element 10 and the methods of manufacturing these layers will now be described.

<Transparent Substrate 13>

Preferably, the transparent substrate basically includes a transparent substrate as a support and one or more barrier layers having a refractive index of 1.4 to 1.7.

(1) TRANSPARENT SUBSTRATE

The transparent substrate used in the present invention may be any known glass substrate or film substrate. The structure composed of a light scattering layer and a smoothing layer according to the present invention should act irrespective of the type of the substrate. A preferred transparent substrate used in the present invention preferably has gas bather characteristics such as resistance to moisture and resistance to gas permeability required for the organic light emitting element. Preferably, a film substrate includes a layer for enhancing the bather performance.

The "transparent substrate" according to the present invention refers to a substrate having a transmittance of 70% or more. The transmittance is preferably 80% or more, more preferably 90% or more, particularly preferably 95% or more.

The "transparent substrate" according to the present invention preferably has flexibility. Throughout the specification, the term "flexibility" of a substrate indicates that the substrate can be wound around a roll having a diameter of 50 mm, more preferably 30 mm at a predetermined tension without breakage.

Examples of the transparent substrates that can be wound around such a roll include known substrates, specifically include resin films composed of acrylic acid esters, methacrylic acid esters, poly(ethylene terephthalate) (PET), poly (butylene terephthalate), poly(ethylene naphthalate) (PEN), polycarbonates (PC), polyarylates, poly(vinyl chloride) (PVC), polyethylene (PE), polypropylene (PP), polystyrene (PS), nylon (Ny), aromatic polyamides, polyether ether ketones, polysulfone, polyether sulfones, polyimides, and polyether imides; a heat-resistant transparent film having a basic skeleton of silsesquioxane having an organic-inorganic hybrid structure (product name: Sila-DEC, made by Chisso Corporation); and resin films composed of laminates of two or more layers formed of these resins.

Poly(ethylene terephthalate) (PET), poly(butylene terephthalate), poly(ethylene naphthalate) (PEN), and polycarbonates (PC) are preferably used in view of material cost and commercial availability. A heat-resistant transparent film having a basic skeleton of silsesquioxane having an organic-inorganic hybrid structure can be preferably used in view of optical transparency, heat resistance, and adhesion to an inorganic layer and a gas bather layer.

Especially in view of transparency, heat resistance, handling characteristics, strength, and cost, preferred are biaxially stretched poly(ethylene terephthalate) films, biaxially stretched poly(ethylene naphthalate) films, polyether sulfone films, and polycarbonate films, and more preferred are biaxially stretched poly(ethylene terephthalate) films and biaxially stretched poly(ethylene naphthalate) films.

In order to minimize the shrinkage at the time of thermal expansion, most preferred are films subjected to a thermal shrinkage treatment at low temperature, such as annealing.

The transparent substrate has a thickness of preferably 10 to 500 µm, more preferably 20 to 250 µm, still more preferably 30 to 150 µm. A transparent substrate having a thickness ranging from 10 to 500 µm attains stable gas barrier characteristics and transfer characteristics suitable for the roll-to-roll process.

(2) BARRIER LAYER (2.1) Properties and Method of Forming Bather Layer

If the transparent substrate of the present invention is a film substrate, it should be noted that the film substrate includes one or more barrier layers having a refractive index of 1.4 or more and 1.7 or less (low-refractive index layers). The barrier layer(s) can be prepared with any known material. For example, the following materials can be preferably used.

The bather layer contains an inorganic precursor compound, and is composed of at least one layer formed by application of a coating solution containing an inorganic precursor compound onto a transparent substrate.

The coating solution can be applied by any appropriate process.

Specific examples thereof include roll coating, flow coating, ink jetting, spray coating, printing, dip coating, casting, bar coating, and gravure printing.

The thickness of application can be appropriately determined according to the purpose. For example, the thickness can be determined such that the thickness of the dried coating solution is preferably about 1 nm to 10 µm, more preferably about 10 nm to 10 µm, most preferably about 30 nm to 1 µm.

(2.2) Inorganic Precursor Compound

The inorganic precursor compound usable in the present invention can be any compound which can form a metal oxide, a metal nitride, or a metal oxide nitride by irradiation with ultraviolet light under a specific vacuum atmosphere. Preferably, compounds suitably used in the method according to the present invention can be reformed at relatively low temperature as described in Japanese Patent Application Laid-Open Publication No. H8-112879.

Specific examples of such compounds include polysiloxanes having Si—O—Si bonds (including polysilsesquioxane), polysilazanes having Si—N—Si bonds, and polysiloxazanes having both Si—O—Si and Si—N—Si bonds. These compounds can be used in the form of a mixture. Two or more different compounds can be sequentially or simultaneously deposited.

(2.2.1) Polysiloxane

The polysiloxanes used in the present invention can include general structure units $[R_3SiO_{1/2}]$, $[R_2SiO]$, $[RSiO_{3/2}]$, and $[SiO_2]$. In the formulae, R is independently selected from the group consisting of a hydrogen atom, an alkyl group having 1 to 20 carbon atoms (such as methyl, ethyl, and propyl), an aryl group (such as phenyl), and an unsaturated alkyl group (such as vinyl). Specific examples of polysiloxane groups include $[PhSiO_{3/2}]$, $[MeSiO_{3/2}]$, $[HSiO_{3/2}]$, $[MePhSiO]$, $[Ph_2SiO]$, $[PhViSiO]$, $[ViSiO_{3/2}]$, $[MeHSiO]$, $[MeViSiO]$, $[Me_2SiO]$, and $[Me_3SiO_{1/2}]$. Mixtures or copolymers of different polysiloxanes can also be used.

(2.2.2) Polysilsesquioxane

Among these polysiloxanes above, polysilsesquioxane is preferably used in the present invention. Polysilsesquioxane includes silsesquioxane in the structure unit. The compound "silsesquioxane" is one of polysiloxanes represented by [RSiO$_{3/2}$], and is typically prepared through hydrolysis and polycondensation of a compound represented by RSiX$_3$ (where R is a hydrogen atom, an alkyl group, an alkenyl group, an aryl group, or an aralkyl group; X is a halogen or an alkoxy group). Molecules forming silsesquioxane typically have an amorphous structure, a ladder structure, a cage structure, or a partially open cage structure (cage structure from one silicon atom is removed or a cage structure in which silicon-oxygen bonds are partially cut).

Among these polysilsesquioxanes, the so-called hydrogen silsesquioxane polymers are preferably used. Examples of the hydrogen silsesquioxane polymers include hydride siloxane polymers represented by a formula HSi(OH)$_x$(OR)$_y$O$_{z/2}$ (where R's each represent an organic group or a substituted organic group; R forms a hydrolytic substituent if R bonded through an oxygen atom to silicon; x=0 to 2, y=0 to 2, z=1 to 3, and x+y+z=3). Examples of R include alkyl groups, such as methyl, ethyl, propyl and butyl; aryl groups, such as phenyl; alkenyl groups, such as allyl and vinyl. These resins defined as above can be completely condensed into (HSiO$_{3/2}$)$_n$, or can be partially hydrolyzed (that is, partially containing Si—OR) and/or partially condensed (that is, partially containing Si—OH).

Examples of cage silsesquioxanes include silsesquioxane represented by Formula (1) [RSiO$_{3/2}$]$_8$, silsesquioxane represented by Formula (2) [RSiO$_{3/2}$]$_{10}$, silsesquioxane represented by Formula (3) [RSiO$_{3/2}$]$_{12}$, silsesquioxane represented by Formula (4) [RSiO$_{3/2}$]$_{14}$, and silsesquioxane represented by Formula (5) [RSiO$_{3/2}$]$_{16}$:

[Formula 1]

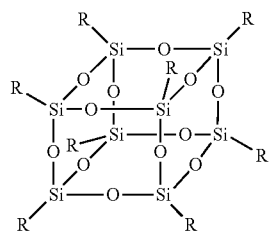

Formula (1)

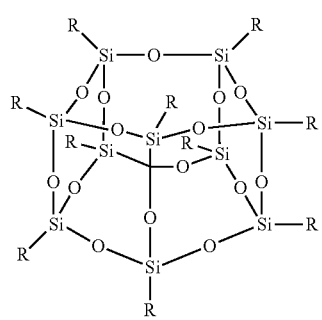

Formula (2)

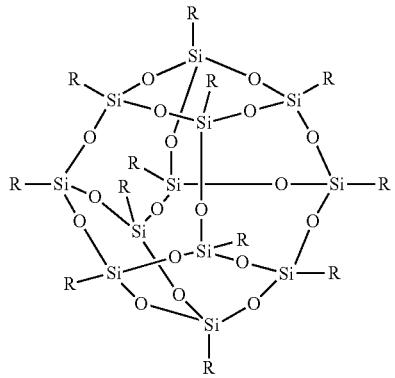

Formula (3)

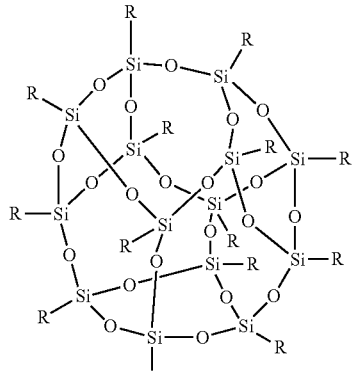

Formula (4)

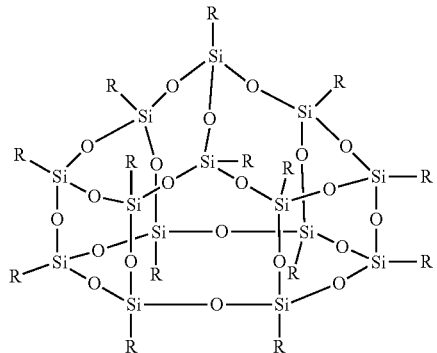

Formula (5)

In the cage silsesquioxane represented by [RSiO$_{3/2}$]$_n$, n is an integer of 6 to 20, preferably 8, 10, or 12, particularly preferably 8. A mixture of cage silsesquioxanes at n=8, n=10, and n=12 is also particularly preferred. Preferred examples of cage silsesquioxane having partially open silicon-oxygen bonds [RSiO$_{3/2}$]$_{n-m}$(O$_{1/2}$H)$_{2+m}$ (where n is an integer of 6 to 20 and m is 0 or 1) include trisilanol having a partially open cage structure of a cage structure represented by Formula (1), silsesquioxane represented by Formula (6) [RSiO$_{3/2}$]$_7$(O$_{1/2}$H)$_3$, silsesquioxane represented by Formula (7) [RSiO$_{3/2}$]$_8$(O$_{1/2}$H)$_2$, and silsesquioxane represented by Formula (8) [RSiO$_{3/2}$]$_8$(O$_{1/2}$H)$_2$:

[Formula 2]

Formula(6)

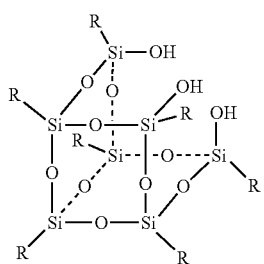

Formula(7)

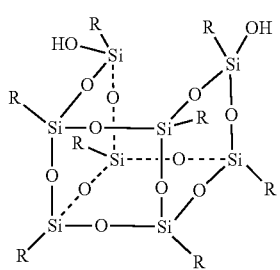

Formula(8)

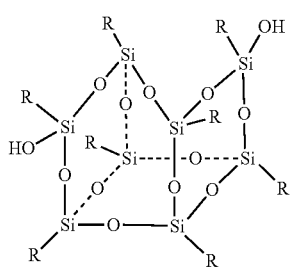

Examples of R in Formulae (1) to (8) include a hydrogen atom, saturated hydrocarbon groups having 1 to 20 carbon atoms, alkenyl groups having 2 to 20 carbon atoms, aralkyl groups having 7 to 20 carbon atoms, and aryl groups having 6 to 20 carbon atoms. Among these groups, R is preferably a polymerizable functional group which enables a polymerization reaction.

Examples of the saturated hydrocarbon groups having 1 to 20 carbon atoms include methyl, ethyl, n-propyl, i-propyl, butyl (such as n-butyl, i-butyl, t-butyl, and sec-butyl), pentyl (such as n-pentyl, i-pentyl, neopentyl, and cyclopentyl), hexyl (such as n-hexyl, i-hexyl, and cyclohexyl), heptyl (such as n-heptyl and i-heptyl), octyl (such as n-octyl, i-octyl, and t-octyl), nonyl (such as n-nonyl and i-nonyl), decyl (such as n-decyl and i-decyl), undecyl (such as n-undecyl and i-undecyl), and dodecyl (such as n-dodecyl and i-dodecyl) groups. Preferred are saturated hydrocarbons having preferably 1 to 16 carbon atoms, particularly preferably 1 to 12 carbon atoms in consideration of the balance among melt fluidity, flame retardancy, and operation characteristics during formation of the barrier layer.

Examples of the alkenyl groups having 2 to 20 carbon atoms include non-cyclic alkenyl and cyclic alkenyl groups. Examples thereof include vinyl, propenyl, butenyl, pentenyl, hexenyl, cyclohexenyl, cyclohexenylethyl, norbornenylethyl, heptenyl, octenyl, nonenyl, decenyl, undecenyl, and dodecenyl groups. Preferred are alkenyl groups having preferably 2 to 16 carbon atoms, particularly preferably 2 to 12 carbon atoms in consideration of the compatibility among melt fluidity, flame retardancy, and operation characteristics during formation of the barrier layer.

Examples of the aralkyl groups having 7 to 20 carbon atoms include a benzyl group, a phenethyl group, and benzyl and phenethyl groups formed by mono- or multi-substituting alkyl groups having 1 to 13 carbon atoms, preferably 1 to 8 carbon atoms.

Examples of the aryl groups having 6 to 20 carbon atoms include a phenyl group, a tolyl group, and phenyl, tolyl, and xylyl groups substituted by an alkyl group having 1 to 14 carbon atoms, preferably 1 to 8 carbon atoms.

For the cage silsesquioxanes, compounds commercially available from Sigma-Aldrich Corporation, Hybrid Plastics, Inc., Chisso Corporation, and AZmax Co., Ltd. may be used as they are, or compounds prepared by methods described in Journal of American Chemical Society, vol. 111, page 1741 (1989) and others may be used.

The polysilsesquioxane having a partially open cage structure refers to a compound having a cage structure having three or less Si—OH bonds, which is derived from cleavage of Si—O—Si bonds in one cage unit represented by a formula $[RSiO_{3/2}]_8$, or a compound having a cage structure represented by $[RSiO_{3/2}]_8$ from which at most one Si atom is removed.

Use of hydrogen silsesquioxane such as $[HSiO_{3/2}]_8$ is also preferred in cage silsesquioxane.

(2.2.3) Polysilazane

The polysilazane used in the present invention refers to a polymer having a silicon-nitrogen bond, and is an inorganic precursor polymer for $SiO_2$, $Si_3N_4$ including Si—N, Si—H, or N—H, and an intermediate solid solution $SiO_xN_y$ (x: 0.1 to 1.9, y: 0.1 to 1.3) between $SiO_2$ and $Si_3N_4$.

The polysilazane preferably used in the present invention is represented by Formula (A):

$$—[Si(R_1)(R_2)—N(R_3)]—$$ Formula (A)

where $R_1$, $R_2$, $R_3$ each represent a hydrogen atom, an alkyl group, an alkenyl group, a cycloalkyl group, an aryl group, an alkylsilyl group, an alkylamino group, or an alkoxy group.

In the present invention, particularly preferred is perhydropolysilazane which all of $R_1$, $R_2$, and $R_3$ are hydrogen atoms, in view of the compactness of the bather layer.

In organopolysilazane in which hydrogen moieties bonding to Si are partially replaced with an alkyl group, the alkyl group, such as a methyl group, contained in the organopolysilazane can enhance the adhesion to the substrate, and can impart toughness to ceramic layers formed of hard and fragile polysilazane, advantageously preventing cracking in thicker layers. These perhydropolysilazanes and organopolysilazanes can also be appropriately selected according to the application, and can be used in the form of a mixture.

It is presumed that perhydropolysilazanes have linear segments and cyclic segments composed of 6- and 8-membered rings. The perhydropolysilazane has a number average molecular weight (Mn) of about 600 to 2000 (in terms of polystyrene). The perhydropolysilazane is liquid or solid depending on the molecular weight. These perhydropolysilazanes are sold in the form of a solution in an organic solvent, and such commercially available products can be used without any treatment as coating solutions containing polysilazane.

Another examples of polysilazanes formed into ceramics at low temperatures include silicon alkoxide-added polysilazane prepared through a reaction of the polysilazane with silicon alkoxide (Japanese Patent Application Laid-Open Publication No. H5-238827), glycidol-added polysilazane prepared through a reaction with glycidol (Japanese Patent Application Laid-Open Publication No. H6-122852), alcohol-added polysilazane prepared through a reaction with alcohol (Japanese Patent Application Laid-Open Publication No. H6-240208), metal carboxylate-added polysilazane prepared through a reaction with a metal carboxylate (Japanese Patent Application Laid-Open Publication No. H6-299118), acetylacetonato complex-added polysilazane prepared through a reaction with an acetylacetonato complex containing a metal (Japanese Patent Application Laid-Open Publication No. H6-306329), and polysilazane containing metal nanoparticles prepared through addition of metal nanoparticles (Japanese Patent Application Laid-Open Publication No. H7-196986).

Organic solvents readily reactive with polysilazane, such as alcohols and solvents having a moisture content, should be avoided in preparation of a liquid containing polysilazane. Usable organic solvents are specifically hydrocarbon solvents, such as aliphatic hydrocarbons, alicyclic hydrocarbons, and aromatic hydrocarbons, halogenated hydrocarbon solvents, and ethers, such as aliphatic ethers and alicyclic ethers. Specific examples thereof include hydrocarbons, such as pentane, hexane, cyclohexane, toluene, xylene, Solvesso, and turpentine; halogenated hydrocarbons, such as methylene chloride and trichloroethane; and ethers, such as dibutyl ether, dioxane, and tetrahydrofuran. These solvents may be selected according to the solubility of polysilazane and the evaporation rate of the solvent. These solvents can be used in combination.

The concentration of the polysilazane in the coating solution containing polysilazane depends on the thickness of silica or the pot life of the coating solution and ranges from about 0.2 to 35 mass %.

The organopolysilazane may be a derivative in which hydrogen moieties bonding to Si are partially replaced with an alkyl group. The organopolysilazane having an alkyl group, particularly a methyl group having the smallest molecular weight can enhance the adhesion to the substrate, and can give toughness to hard and fragile silica layers, preventing cracking in layers having larger thicknesses.

To promote reforming treatment of polysilazane into a silicon oxide compound, a catalyst, such as amine or metal, can also be added to the coating solution. Specific examples of such coating solutions include AQUAMICA NAX120-20, NN110, NN310, NN320, NL110A, NL120A, NL150A, NP110, NP140, and SP140 made by AZ Electronic Materials plc.

(2.2.4) Polysiloxazane

The polysiloxazane according to the present invention has main repeating units represented by —[(SiH$_2$)$_n$(NH)$_r$]— and —[(SiH$_2$)$_m$O]— (where n, m, and r are independently 1, 2, or 3).

(2.2.5) Catalyst

The solution containing an inorganic precursor according to the present invention (also referred to as coating solution) may contain a catalyst as needed.

Specific examples the catalyst include N-heterocyclic compounds, such as 1-methylpiperazine, 1-methylpiperidine, 4,4'-trimethylenedipiperazine, 4,4'-methylene-bis(1-methylpiperidine), diazabicyclo-[2,2,2]octane, cis-2,6-dimethylpiperazine, 4-(4-methylpiperidine)pyridine, pyridine, dipyridine, α-picoline, β-picoline, γ-picoline, piperidine, lutidine, pyrimidine, pyridazin, 4,4'-trimethylenedipyridine, 2-(methylamino)pyridine, pyrazine, quinoline, quinoxaline, triazine, pyrrole, 3-pyrroline, imidazole, triazole, tetrazole, and 1-methylpyrrolidine; amines, such as methylamine, dimethylamine, trimethylamine, ethylamine, diethylamine, triethylamine, propylamine, dipropylamine, tripropylamine, butylamine, dibutylamine, tributylamine, pentylamine, dipentylamine, tripentylamine, hexylamine, dihexylamine, trihexylamine, heptylamine, diheptylamine, octylamine, dioctylamine, trioctylamine, phenylamine, diphenylamine, and triphenylamine; and other compounds, such as 1,8-diazabicyclo[5,4,0]-7-undecene (DBU), 1,5-diazabicyclo[4,3,0]-5-nonene (DBN), 1,5,9-triazacyclododecane, and 1,4,7-triazacyclononane.

Examples of preferred catalysts also include organic acids, inorganic acids, metal carboxylates, acetylacetonato complexes, and metal nanoparticles. Examples of the organic acids include acetic acid, propionic acid, butyric acid, valeric acid, maleic acid, and stearic acid. Examples of the inorganic acids include hydrochloric acid, nitric acid, sulfuric acid, phosphorus acid, hydrogen peroxide, chloric acid, and hypochlorous acid. The metal carboxylates refer to compounds represented by a formula (RCOO)$_n$M [where R represents an aliphatic or alicyclic group having 1 to 22 carbon atoms; M represents at least one metal selected from the group consisting of Ni, Ti, Pt, Rh, Co, Fe, Ru, Os, Pd, Ir, and Al; n represents an atomic valence of M]. The metal carboxylates may be anhydrides or hydrates thereof. The acetylacetonato complex is composed of a metal atom coordinated with an anion acac$^-$ generated from acetylacetone (2,4-pentadione) by acidic dissociation, and is typically represented by a formula (CH$_3$COCHCOCH$_3$)$_n$M [where M represents a metal having an ionic valency n]. Examples of a suitable metal M include nickel, platinum, palladium, aluminum, and rhodium. Metal nanoparticles of Au, Ag, Pd, and Ni are preferred, and particularly those of Ag are preferred. The metal nanoparticles have a particle size of preferably less than 0.5 µm, more preferably 0.1 µm or less, still more preferably less than 0.05 µm. Besides these metal nanoparticles, organic metal compounds, such as peroxides, metal chlorides, ferrocene, and zirconocene, can also be used. Platinum vinyl siloxane used as a curing agent for silicone polymers can also be used.

These catalysts can be compounded with the inorganic precursor compound in an amount of preferably 0.01 to 10 mass %, more preferably 0.05 to 2 mass %.

<Internal Light Extracting Layer (2)>

(1) CONFIGURATION AND PROPERTIES

The internal light extracting layer 2 is interposed between the transparent substrate 13 and the transparent metal electrode 1, and includes a light scattering layer 2a and a smoothing layer 2b sequentially disposed on the transparent substrate 13 in this order.

The internal light extracting layer 2 has a refractive index in the range of 1.7 or more and less than 2.5 at a wavelength of 550 nm.

The waveguide-mode light confined within the luminous layer of the organic light emitting element and the plasmon-mode light reflected from the cathode are light components in specific optical modes. Extraction of these light components needs an internal light extracting layer having a refractive index of 1.7 or more. Substantially no light is present in a region having a refractive index of 2.5 or more even in the highest mode. An internal light extracting layer having a refractive index of 2.5 or more would not increase the amount to light to be extracted.

Actually, it is preferred that the light scattering layer 2a and the smoothing layer 2b both have an refractive index in the range of 1.7 or more and less than 2.5. Determination of individual refractive indices of these layers often has technical difficulties; hence, the overall internal light extracting layer 2 may have a refractive index within this range The refractive index of the internal light extracting layer 2 is determined as follows: the layer is irradiated at 25° C. with a light beam having the shortest local maximum wavelength among light beams emitted from a light emitting unit, and the refractive index is measured with an Abbe refractometer (made by ATAGA Co., Ltd., DR-M2) (the refractive index of the light scattering layer and that of the smoothing layer are determined in the same manner).

The internal light extracting layer 2 has a haze value (proportion of the scattering transmittance to the total light transmittance) of 30% or more. A haze value of 30% or more can enhance luminescence efficiency.

The haze value refers to a physical property expressed by a numeric value calculated in consideration of (i) the effect of the difference in refractive index between the compositions in the layer and (ii) the effect of the shape of the surface of the layer. In the present invention, the haze value of the internal light extracting layer 2 including the light scattering layer 2a and the smoothing layer 2b laminated thereon is determined. Through control of the surface roughness of the layer in the range of less than a predetermined value, a haze value independent of the effect (ii) can be attained.

The internal light extracting layer 2 according to the present invention has a transmittance of preferably 50% or more, more preferably 55% or more, particularly preferably 60% or more.

Although a higher transmittance of the internal light extracting layer 2 is preferred, it is presumed that the actual transmittance is less than 80% of the determined transmittance. The transmittance of the internal light extracting layer 2 is more preferably less than 85%, particularly preferably less than 90%.

(2) LIGHT SCATTERING LAYER

(2.1) Refractive Index

The light scattering layer 2a preferably has a high refractive index layer within the range of 1.7 or more and less than 3.0. In this case, the light scattering layer 2a may be composed of a single material having a refractive index of 1.7 or more and less than 3.0. Alternatively, two or more compounds may be mixed to form a layer having a refractive index of 1.7 or more and less than 3.0. In a layer composed of a mixture of materials, the refractive index of the light scattering layer 2a can be defined as a calculated refractive index, that is, the sum of the refractive indices of the respective materials multiplied by the corresponding mixed proportions of the materials. In this case, the refractive indices of the respective materials can be less than 1.7 or 3.0 or more as long as the layer formed of a mixture thereof has a refractive index of 1.7 or more and less than 3.0.

The light scattering layer 2a according to the present invention is a mixed light scattering layer (scattering film) composed of a mixture of a layer matrix and light scattering particles, and utilizes the difference in refractive index between these materials.

The light scattering layer 2a is disposed on the outermost surface of the transparent substrate 13 on the transparent metal electrode 1 side to enhance outcoupling efficiency.

The light scattering layer 2a is composed of a layer matrix and light scattering particles contained in the layer matrix.

The difference in refractive index between the layer matrix, i.e., a resin material (monomer or binder) described later and the light scattering particles is 0.03 or more, preferably 0.1 or more, more preferably 0.2 or more, particularly preferably 0.3 or more. If the difference in refractive index between the layer matrix and the light scattering particles is 0.03 or more, a light scattering effect occurs at the interface of the layer matrix and the light scattering particles. A larger difference in refractive index preferably generates larger refraction at the interface to enhance the light scattering effect.

(2.2) Average Particle Size of Light Scattering Particle

The light scattering layer 2a scatters light utilizing the difference in refractive index between the layer matrix and the light scattering particles as described above. For this reason, the light scattering layer 2a preferably contains a transparent light scattering particle having a particle size equal to or more than a particle size enabling generation of Mie scattering in the visible light region. The average particle size is 0.2 μm or more.

The upper limit of the average particle size is less than 1 μm. A larger particle size results in an increase in the thickness of the smoothing layer 2b smoothing the roughness of the light scattering layer 2a containing the light scattering particles, increasing a load on production steps and absorption of light in the layer.

The average particle size of the high-refractive index particle (light scattering particle) can be determined by image processing of a transmission electron microscopic photograph (TEM cross-section).

(2.3) Types of Light Scattering Particles

Any type of light scattering particles can be appropriately selected according to the purpose, and may be organic or inorganic nanoparticles. Among these particles preferred are inorganic nanoparticles having high refractive indices.

Examples of the organic nanoparticles having high refractive indices include beads of poly(methyl methacrylate), acrylic-styrene copolymers, melamines, polycarbonates, styrene, crosslinked polystyrene, poly(vinyl chloride), and benzoguanamine-melamine formaldehyde.

Examples of inorganic nanoparticles having high refractive indices include inorganic particles of at least one oxide selected from the group consisting of oxides of zirconium, titanium, indium, zinc, antimony, cerium, niobium, and tungsten. Specific examples of such inorganic oxide particles include $ZrO_2$, $TiO_2$, $BaTiO_3$, $In_2O_3$, $ZnO$, $Sb_2O_3$, ITO, $CeO_2$, $Nb_2O_5$, and $WO_3$. Among these particles, preferred are $TiO_2$, $BaTiO_3$, $ZrO_2$, $CeO_2$, and $Nb_2O_5$, and more preferred is $TiO_2$. Preferred $TiO_2$ is of a rutile type, which has a catalytic activity lower than an anatase type to enhance the weatherability of the high-refractive index layer or adjacent layers, and has a refractive index higher than that of the anatase type.

Since these particles are contained in a light scattering layer 2a with a high refractive index, surface treated particles or surface-untreated particles can be selected according to the dispersibility of the particles in a dispersion described later or the stability of the dispersion.

Specific examples of materials used in the surface treatment include different inorganic oxides, such as silicon oxide and zirconium oxide; metal hydroxides, such as aluminum hydroxide; and organic acids, such as organosiloxane and stearic acid. These surface treating materials can be used alone or in combination. Among these surface treating materials, preferred are different inorganic oxides and/or metal hydroxides, more preferred are metal hydroxides in view of stable dispersion.

In inorganic oxide particles coated with the surface treating material, the coating amount of the surface treating material (typically, the coating amount is represented by the proportion of the mass of the surface treating material applied to the surfaces of the particles to the mass of the particle) is preferably 0.01 to 99 mass %. A coating amount of the surface treating material of 0.01 mass % or more can sufficiently attain an effect of enhancing the dispersibility of particles and the stability of the dispersion due to the surface treatment. A coating amount of the surface treating material of 99 mass % or less can prevent a reduction in the refractive index of the light scattering layer 2a with a high refractive index.

Besides these high-refractive index materials, quantum dots described in WO 2009/014707 and U.S. Pat. No. 6,608,439 can also be suitable for use.

The high-refractive index particle has a refractive index of 1.7 or more, preferably 1.85 or more, particularly preferably 2.0 or more. A refractive index of 1.7 or more increases the difference in refractive index between the high-refractive index particle and a binder to increase the amount of light to be scattered, enhancing outcoupling efficiency.

The upper limit of the refractive index of the high-refractive index particle is less than 3.0. A larger difference in refractive index between the high-refractive index particle and a binder can attain a sufficient amount of light to be scattered to enhance outcoupling efficiency.

The high-refractive index particles are preferably disposed on or near the interface between the light scattering layer 2a and the smoothing layer 2b in a thickness substantially equal to the average particle size of the light scattering particle. The particles thus disposed can scatter evanescent light totally reflected within the smoothing layer 2b and leaked from the light scattering layer 2a, enhancing outcoupling efficiency.

The content of the high-refractive index particle in the light scattering layer 2a defined as a volume filling rate is within the range of preferably 1.0 to 70%, more preferably 5 to 50%. Such a content can generate inhomogeneous distribution of the refractive index on the interface between the light scattering layer 2a and the smoothing layer 2b to increase the amount of light to be scatted, enhancing outcoupling efficiency.

(2.4) Relationship Between Thickness and Average Particle Size of Particles

The ratio T/D is preferably 0.75 to 3.0, more preferably 1.0 to 2.5, still more preferably 1.25 to 2.0 where the thickness of the light scattering layer is defined as T and the average particle size of the light scattering particles contained in the light scattering layer is defined as D.

FIGS. 2 to 6 each are a microscopic photograph of a cross-section of a laminated body of a light scattering layer (large particle portion) and a smoothing layer, and shows examples of the relationship between the thickness of the light scattering layer (large particle portion) and the average particle size of the light scattering particles.

Figure 2:
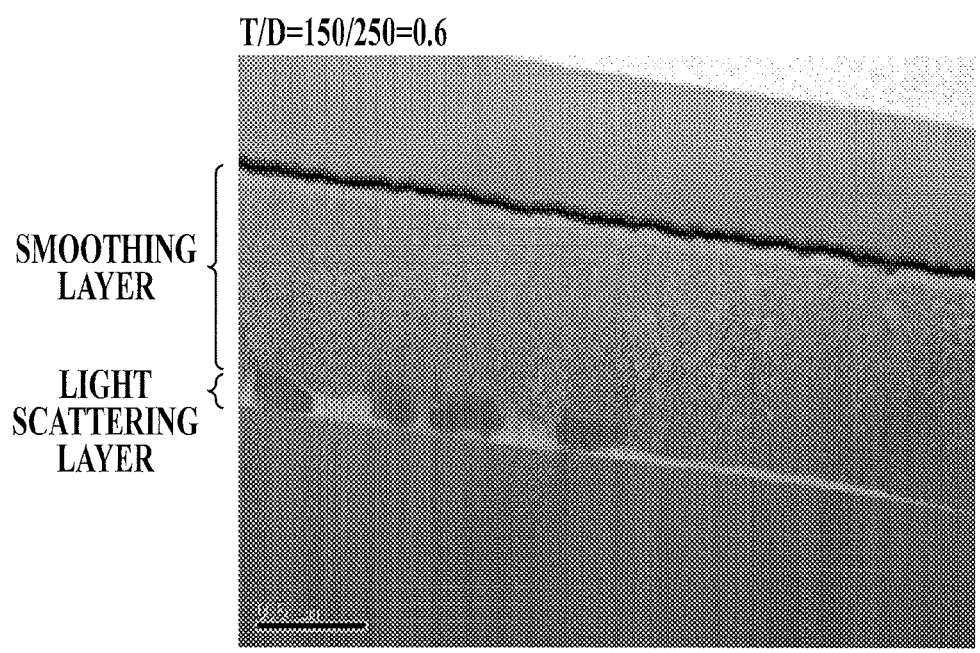
FIG. 2 is a microscopic photograph of a cross-section of an exemplary laminated body of a light scattering layer and a smoothing layer where the ratio T/D, (the thickness of the light scattering layer)/(the average particle size of the light scattering particle), is 0.6.
Figure 3:
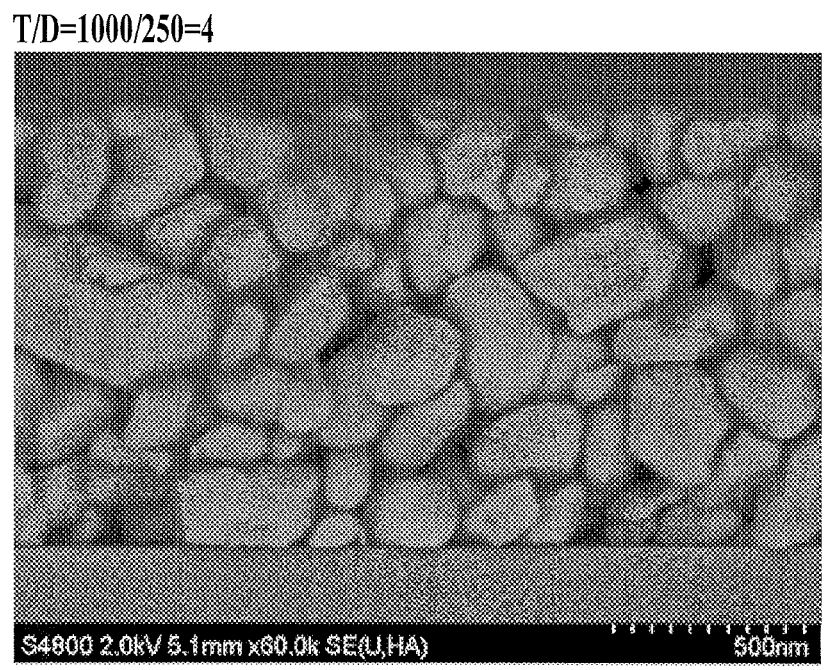
FIG. 3 is a microscopic photograph of a cross-section of an exemplary laminated body of a light scattering layer and a smoothing layer where the ratio T/D, (the thickness of the light scattering layer)/(the average particle size of the light scattering particle), is 4.
Figure 4:
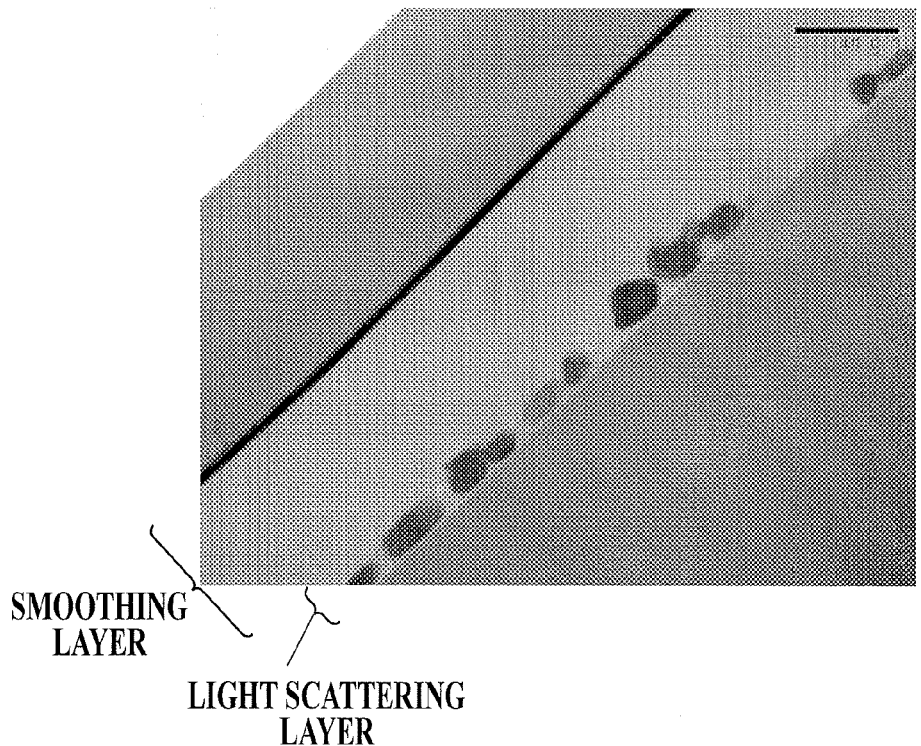
FIG. 4 is a microscopic photograph of a cross-section of an exemplary laminated body of a light scattering layer and a smoothing layer where the ratio T/D, (the thickness of the light scattering layer)/(the average particle size of the light scattering particle), is 0.8.
Figure 5:
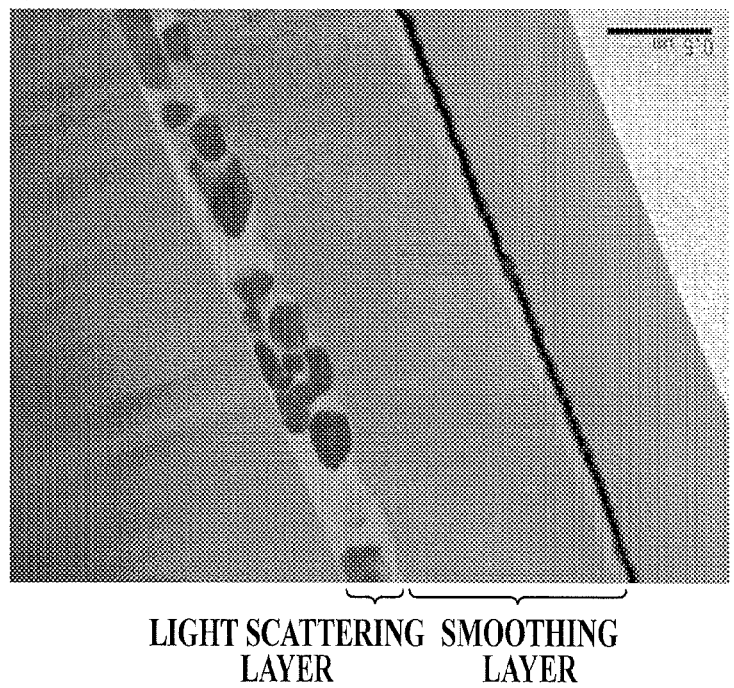
FIG. 5 is a microscopic photograph of a cross-section of an exemplary laminated body of a light scattering layer and a smoothing layer when the T/D, (the thickness of the light scattering layer)/(the average particle size of the light scattering particle), is 1.2.
Figure 6:
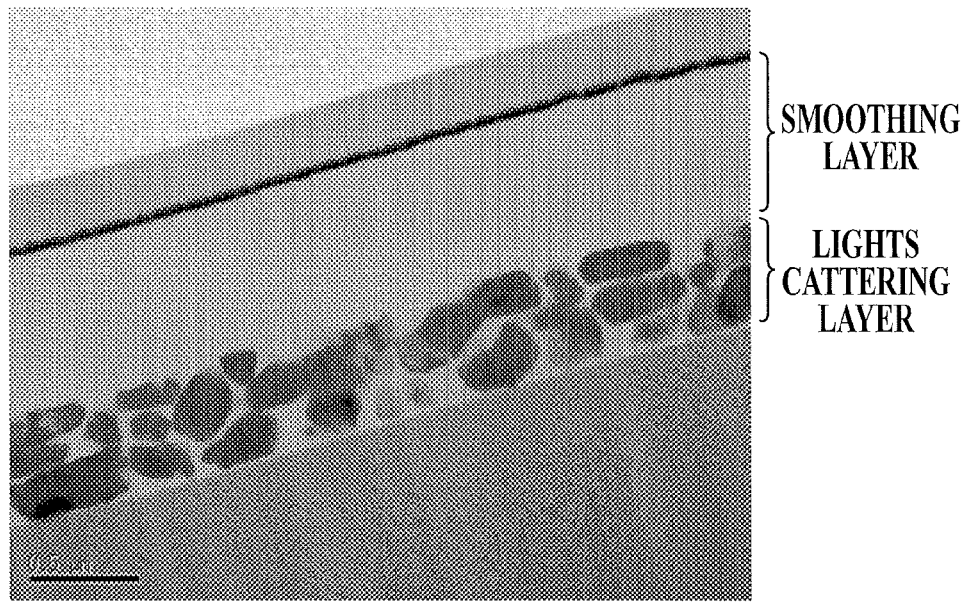
FIG. 6 is a microscopic photograph of a cross-section of an exemplary laminated body of a light scattering layer and a smoothing layer where the ratio T/D, (the thickness of the light scattering layer)/(the average particle size of the light scattering particle), is 2.

A ratio T/D of less than 0.75 is not preferred due to low probability of collision of light to the light scattering particles (see FIG. 2). A ratio T/D of more than 3.0 is not preferred because the light scattering particles absorb a larger amount of light to increase loss of light by absorption (see FIG. 3). In contrast, at a desired ratio T/D of 0.75 to 3.0, the light scattering particles are disposed as shown in FIGS. 4 to 6.

(2.5) In-Plane Occupancy Rate of Light Scattering Particle in Light Scattering Layer The in-plane occupancy rate of the light scattering particle in the light scattering layer is typically 30% or more, preferably 50% or more, more preferably 70% or more.

The term "in-plane occupancy rate of the light scattering particle in the light scattering layer" refers to the area rate of the light scattering particles occupying in the light scattering layer in plan view.

FIGS. 7 to 10 are transmission microscopic photographs of light scattering layers having different in-plane occupancy rates in plan view.

Figure 7:
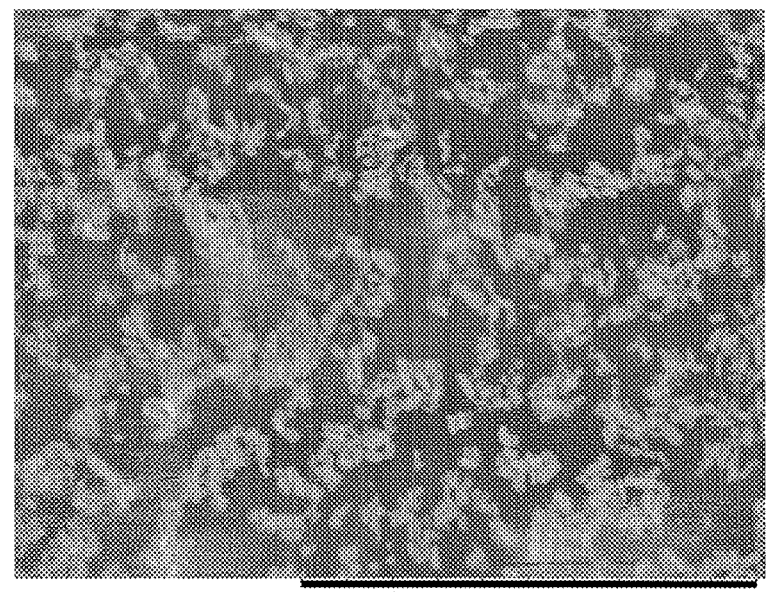
FIG. 7 is a transmission microscopic photograph of an exemplary light scattering layer in plan view when the in-plane occupancy rate of the light scattering particle in the light scattering layer is less than 30%.
Figure 8:
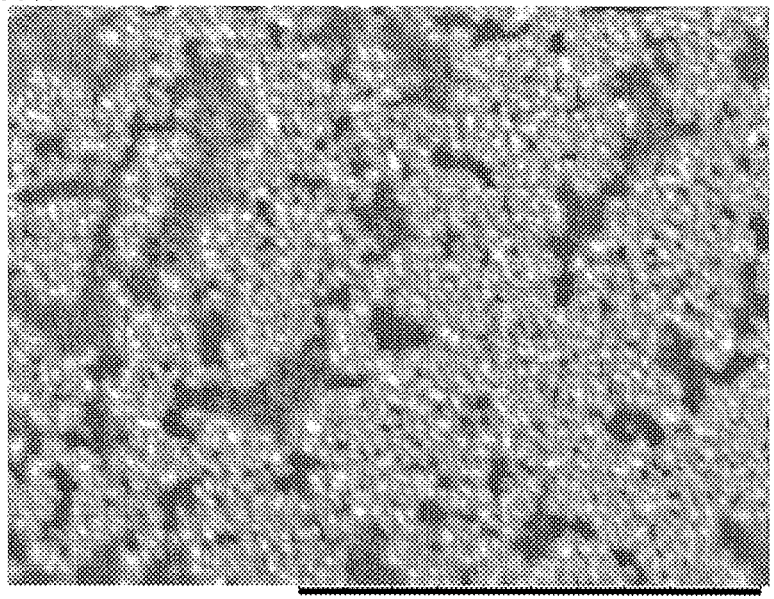
FIG. 8 is a transmission microscopic photograph of an exemplary light scattering layer in plan view when the in-plane occupancy rate of the light scattering particle in the light scattering layer is 30%.
Figure 9:
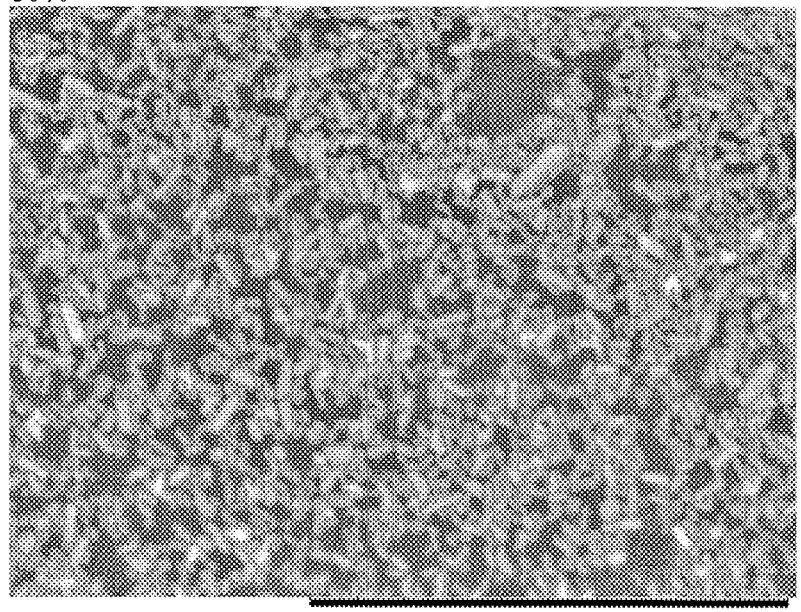
FIG. 9 is a transmission microscopic photograph of an exemplary light scattering layer in plan view when the in-plane occupancy rate of the light scattering particle in the light scattering layer is 50%.
Figure 10:
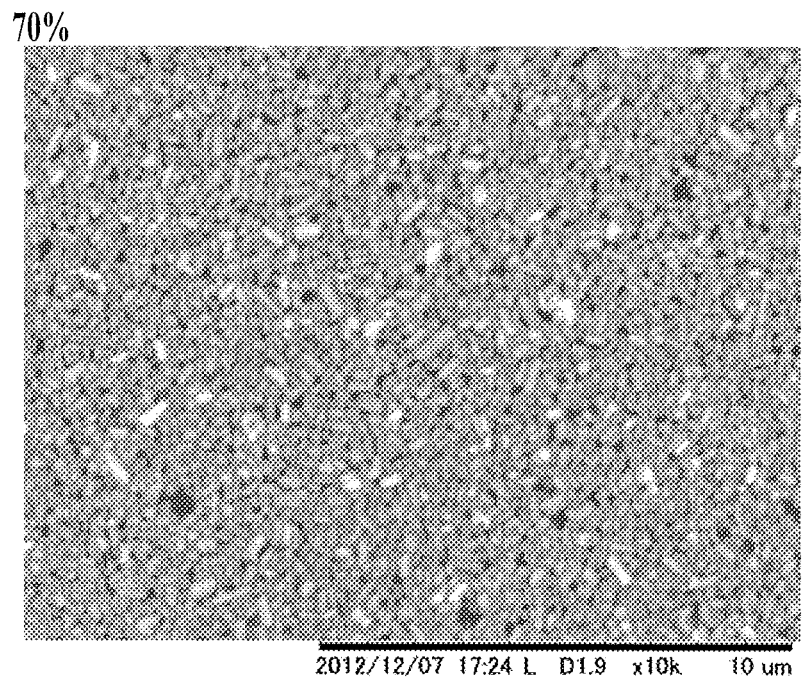
FIG. 10 is a transmission microscopic photograph of an exemplary light scattering layer in plan view when the in-plane occupancy rate of the light scattering particle in the light scattering layer is 70%.

An in-plane occupancy rate of less than 30% generates a state in FIG. 7 showing large gaps between light scattering particles. In contrast, an in-plane occupancy rate of 30% generates a state shown in FIG. 8, an in-plane occupancy rate of 50% generates a state shown in FIG. 9, and an in-plane occupancy rate of 70% or more generates a state shown in FIG. 10 to optimize the scattering of light by the light scattering layer.

(3) SMOOTHING LAYER

The smoothing layer 2b according to the present invention preferably has a high-refractive index layer having a refractive index of 1.7 or more and less than 2.5. The smoothing layer 2b may be composed of a single material or a mixture of materials with proviso that the refractive index is in the range of 1.7 or more and less than 2.5. The refractive index of a layer composed of a mixture of materials is defined as in the refractive index of the light scattering layer 2a.

Figure 11:
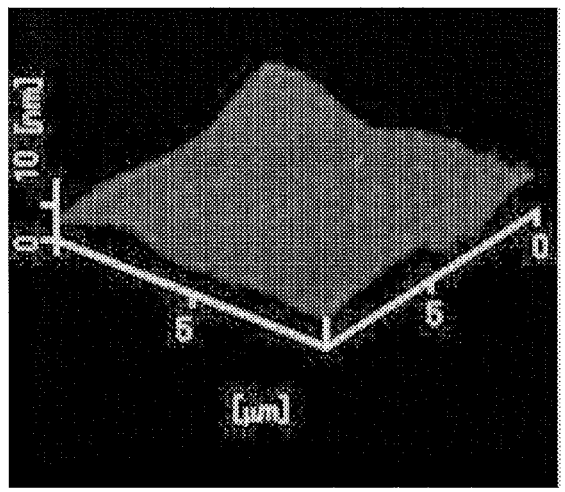
FIG. 11 shows exemplary results of the average roughness of a laminated body of a scattering layer and a smoothing layer determined with an atomic force microscope (AFM).

It should be noted that the smoothing layer 2b has flatness to desirably form a transparent metal electrode 1 thereon. The smoothing layer 2b has an average surface roughness Ra of typically less than 100 nm, preferably less than 30 nm, more preferably less than 10 nm, most preferably less than 5 nm. FIG. 11 shows exemplary results of the average surface roughness Ra of the smoothing layer 2b determined according to the present invention.

Throughout the specification, the term "average surface roughness Ra" refers to the arithmetic average roughness in accordance with JIS B0601-2001.

The average surface roughness Ra is determined by atomic force microscopy (AFM): The irregularity of a surface is continuously measured with a detector equipped with a stylus having a micro tip with an extremely small radius to calculate the roughness from the cross-sectional curve of the irregularity. The microfine irregularity over a 10 µm section on the surface is measured three times with the stylus having a micro tip with an extremely small radius to average the three roughness values determined from fluctuations caused by the fine irregularity.

Examples of the resin (binder) used in the smoothing layer 2b include the same resins as in the light scattering layer 2a (see the description below).

The high-refractive index material contained in the smoothing layer 2b is preferably a nanoparticle sol, particularly preferably a metal oxide nanoparticle sol.

The lower limit of the refractive index of the metal oxide nanoparticle, in bulk, contained in the smoothing layer 2b with a high-refractive index is preferably 1.7 or more, preferably 1.85 or more, still more preferably 2.0 or more, particularly preferably 2.5 or more. The upper limit of the refractive index of the metal oxide nanoparticle is preferably 3.0 or less. The metal oxide nanoparticle having a refractive index of 1.7 or more preferably achieves the target advantageous effects of the invention. The metal oxide nanoparticle having a refractive index of 3.0 or less preferably reduces multiple scattering within the smoothing layer to enhance the transparency of the smoothing layer 2b.

The lower limit of the particle size of the metal oxide nanoparticles (inorganic particles) contained in the smoothing layer 2b with a high-refractive index is preferably 5 nm or more, more preferably 10 nm or more, still more preferably 15 nm or more. The upper limit of the particle size of the metal oxide nanoparticles is preferably 70 nm or less, more preferably 60 nm or less, still more preferably 50 nm or less. A particle size of 5 nm or more preferably prevents aggregation of the metal oxide nanoparticles to enhance the transparency of the smoothing layer. Preferably, a metal oxide nanoparticle having a larger particle size has a smaller surface area to reduce the catalytic activity, so that the degradation of the smoothing layer 2b and its adjacent layers may be delayed. A metal oxide nanoparticle having a particle size of 70 nm or less preferably enhances the transparency of the smoothing layer 2b. The particle size can have any distribution within the advantageous effects of the present invention. The distribution may be wide or narrow, or may have two or more distribution peaks.

The lower limit of the content of the metal oxide nanoparticle in the smoothing layer 2b is 70 mass % or more, preferably 80 mass % or more, more preferably 85 mass % or more of the total mass. The upper limit of the content of the metal oxide nanoparticle is preferably 97 mass % or less, preferably 95 mass % or less. A content of 70 mass % or more of the metal oxide nanoparticle in the smoothing layer 2b facilitates the control of the refractive index of the smoothing layer 2b within the range of 1.80 or more. A content of 95 mass % or less of the metal oxide nanoparticle in the smoothing layer 2b facilitates the formation of the smoothing layer 2b by a coating process and reduces the fragility of the dried layer, resulting in high flex resistance.

In view of stability, the metal oxide nanoparticle contained in the smoothing layer 2b according to the present invention is more preferably $TiO_2$ (titanium dioxide sol). Particularly preferred $TiO_2$ is of a rutile type, which has a catalytic activity lower than that of an anatase type to enhance the weatherability of the smoothing layer 2b and adjacent layers, and has a refractive index higher than that of the anatase type.

The titanium dioxide sol usable in the present invention can be prepared in accordance to Japanese Patent Application Laid-Open Publication Nos. S63-17221, H7-819, H9-165218, and H11-43327, for example.

A primary particle diameter of titanium dioxide nanoparticles is within the range of particularly preferably 5 to 15 nm, most preferably 6 to 10 nm.

(4) LIGHT SCATTERING LAYER/SMOOTHING LAYER

The internal light extracting layer composed of the light scattering layer and the smoothing layer disposed thereon has a refractive index of 1.7 or more and less than 2.5.

The internal light extracting layer has an absorbance of light having a wavelength of 450 to 700 nm, which is preferably less than 15%, more preferably less than 12%, still more preferably less than 10%, particularly preferably less than 8%. An absorbance of less than 15% is preferred in view of luminescence efficiency. The internal light extracting layer can have any lower limit of the absorbance. Preferably the internal light extracting layer is composed of an industrially available material with high transparency The absorbance of light having a wavelength of 450 to 700 nm preferably has a small variation between the maximum absorption value (max value) and the minimum absorption value (min value) at each wavelength from 450 to 700 nm. The ratio, min value/max value, is preferably 0.5 or more, more preferably 0.6 or more, still more preferably 0.7 or more, particularly preferably 0.8 or more. A ratio, min value/max value, of 0.5 or more can prevent the coloring of the internal light extracting layer, which causes light emission having a color different from the original light emission spectrum of the organic light emitting element, and in extreme cases, unsuccessful extraction of white light. The ratio, min value/max value, is ideally 1, and is preferably closer to 1. Preferably the internal light extracting layer is composed of a material having industrially available transparency to visible light.

The internal light extracting layer, which is a laminated body of the light scattering layer and the smoothing layer formed as described above, preferably has a haze value of 30% or more and less than 90%. The haze value is more preferably 35% or more and less than 85%, still more preferably 40% or more and less than 80%, particularly preferably 45% or more and less than 75%. The haze value varies according to the shape of the surface. Throughout the specification, the term "haze value" refers to a value determined with a layer (thickness: 1 μm) having a surface roughness Ra of less than 5 nm determined with an atomic force microscope (AFM).

<Apparatus and Process of Manufacturing Internal Light Extracting Layer 2>

(1) MANUFACTURING APPARATUS

Figure 12:
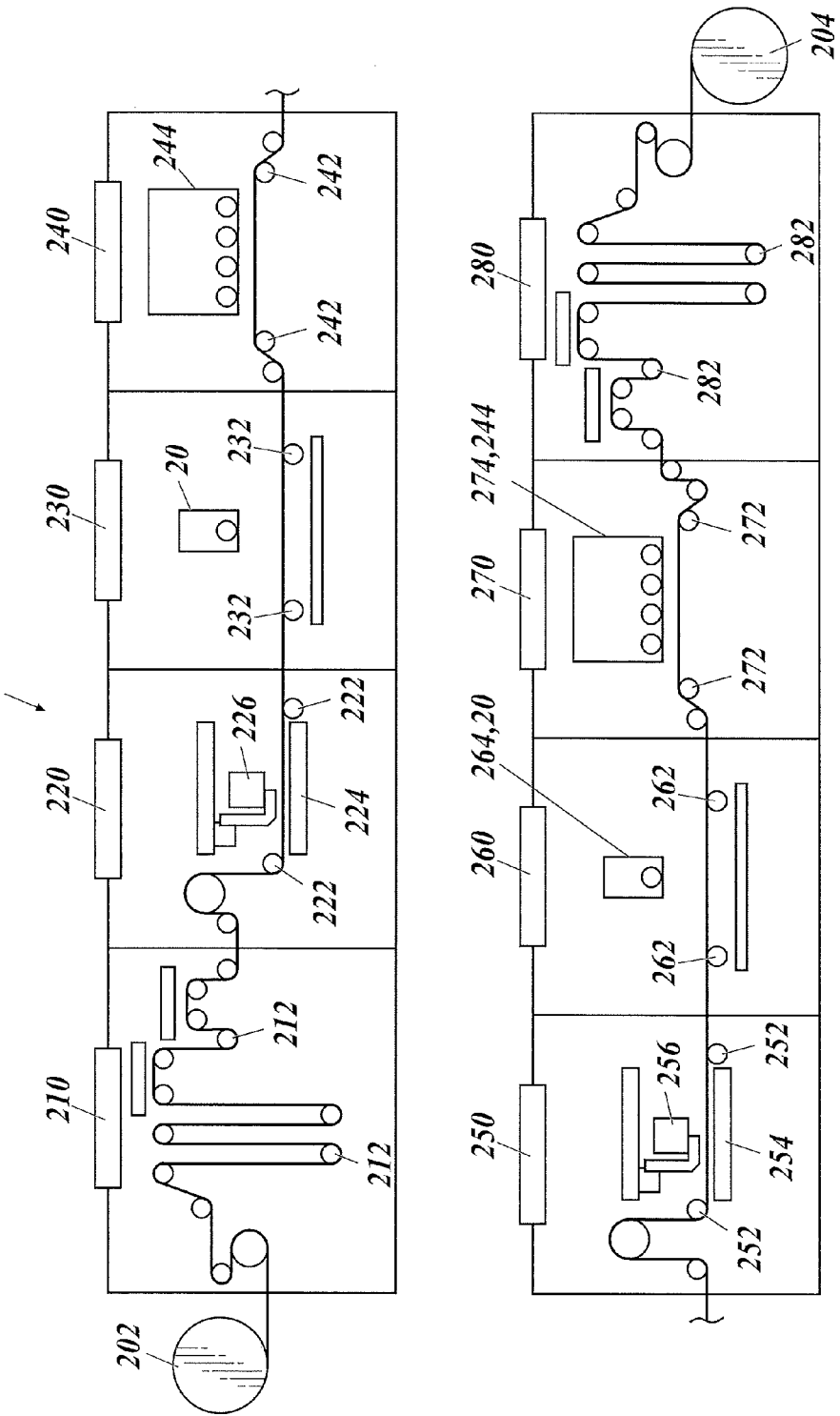
FIG. 12 illustrates a schematic configuration of a manufacturing apparatus of forming an internal light extracting layer.

As illustrated in FIG. 12, by a roll-to-roll process, a manufacturing apparatus 200 forms an internal light extracting layer on a transparent substrate in the midway between a feed roll 202 and a take-up roll 204 while the transparent substrate unwound from the feed roll 202 is being wound around the take-up roll 204.

The manufacturing apparatus 200 mainly includes a transfer unit 210, an inkjet coating unit 220, an IR drying unit 230, a photo-curing unit 240, an inkjet coating unit 250, an IR drying unit 260, a photo-curing unit 270, and a transfer unit 280.

The transfer unit 210 includes a plurality of transfer rollers 212. In the transfer unit 210, the transparent substrate is unwound from the feed roll 202 through the transfer rollers 212 under an adjusted tension applied to the transparent substrate.

The transfer unit 210 may include an accumulator. As one preferred aspect, the accumulator disposed in the transfer unit 210 enables selection between continuous transfer and intermittent transfer.

The inkjet coating unit 220 includes transfer rollers 222, a platen 224, and an inkjet head 226. In the inkjet coating unit 220, a coating solution from the inkjet head 226 is applied onto the transparent substrate supported on the platen 224 into a predetermined pattern in the midway while the transparent substrate is being transferred through the transfer rollers 222.

The IR drying unit 230 includes transfer rollers 232 and an infrared heater 20. In the IR drying unit 230, the applied patterned coating solution is irradiated with infrared light from the infrared heater 20 to be dried, in the midway while the transparent substrate is being transferred through transfer rollers 232.

Figure 13:
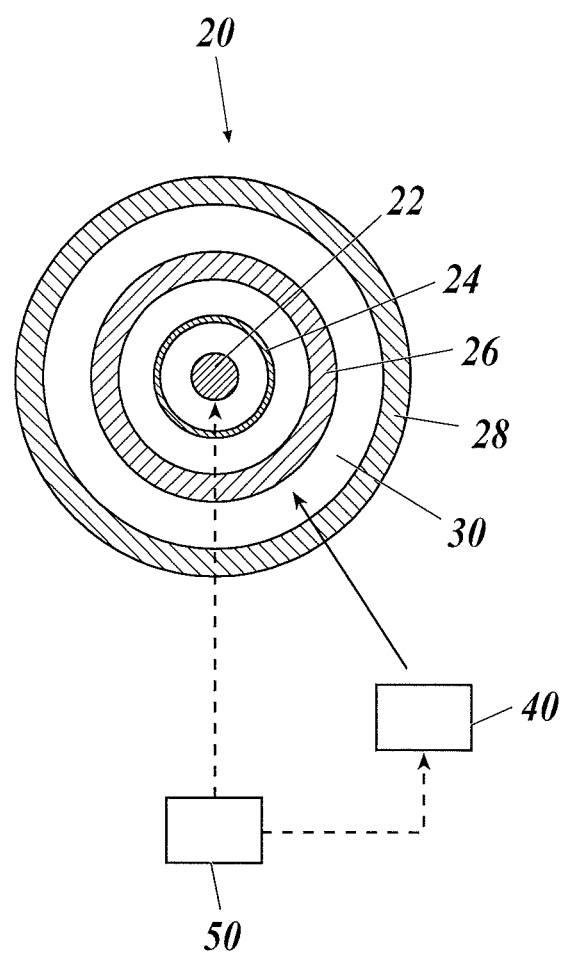
FIG. 13 is a sectional view showing a schematic configuration of an infrared heater.

The infrared heater 20 has a cylindrical shape, and mainly includes a filament 22, a protective tube 24, and filters 26 and 28 concentrically disposed in this order as illustrated in FIG. 13. The filters 26 and 28 absorb radiating infrared light having a wavelength of 3.5 μm or more. The filters 26 and 28 are formed of quartz or borosilicate crown glass, for example. The filters 26 and 28 are preferably composed of quartz in view of heat resistance and thermal shock resistance.

The infrared heater 20 absorbs radiating infrared light having a wavelength of 3.5 μm or more. In detail, because the filters 26 and 28 themselves absorb radiating infrared light having a wavelength of 3.5 μm or more, the filters 26 and 28 are heated by the filament 22 to a high temperature to radiate infrared light having a wavelength longer than those of the infrared light emitted from the filament 22. The infrared heater 20, however, includes a hollow portion 30 disposed between the filters 26 and 28 to circulate a coolant (such as cooling air) therein. The surface temperatures of the filters 26 and 28 are lowered by such a cooling function to reduce secondary radiation from the filters 26 and 28. As a result, infrared light having a wavelength of 3.5 μm or more can be decreased to significantly decrease far-infrared radiation having a wavelength of 5.8 μm or more mainly absorbed by the transparent substrate. An object to be dried can be selectively irradiated with radiating infrared light having a wavelength 3.0 μm absorbed by the hydroxy-containing solvent to dry the coating solution without deformation of the transparent substrate.

The thickness and the number of the filters 26 and 28 can be appropriately determined according to the infrared spectrum as required.

For the cooling function, as described above, two or more filters can be disposed spaced from each other to form one or more hollow portions, through which air is circulated. The filters can be thereby cooled.

Figure 14:
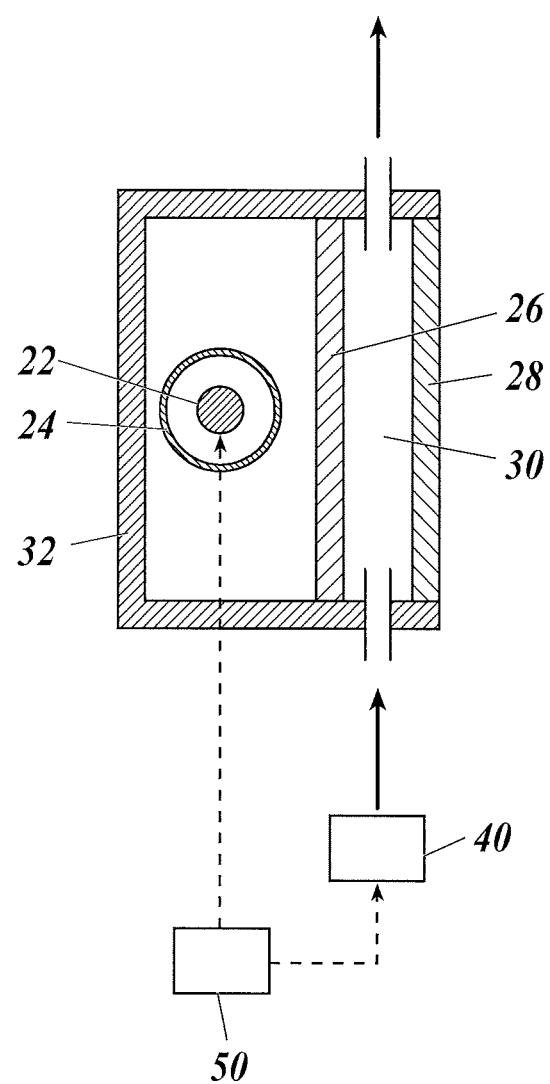
FIG. 14 is a cross-sectional view of a modification of the infrared heater in FIG. 13.

The filters 26 and 28 may be concentrically disposed over the overall cylindrical filament 22. Alternatively, as illustrated in FIG. 14, three sides of the filament 22 (and the protective tube 24) may be covered with a reflective plate 32 and the filters 26 and 28 in the form of a plate may be disposed in parallel on the surface radiating infrared light.

In a multi-layer structure composed of the filters 26 and 28 and an additional filter, adjacent hollow portions between these filters preferably have opposite flows of cooling air to enhance the cooling efficiency. The cooling air on the outlet side may be discharged to the outside of the system, or may be used as part of hot air used in the drying step.

The temperature of the filament 22 of the infrared heater 20 is preferably 600° C. or more in view of compatibility between drying characteristics of the coating solution and prevention of deformation of the transparent substrate and preferably 3000° C. or less in view of the heat resistance of the filament 22.

According to the present embodiment, the radiation energy in the wavelength region of the light absorbed by the hydroxy-containing solvent can be increased according to the temperature of the filament.

The temperature of the filament can be appropriately determined according to desired application and drying conditions. The temperature of the filament can be measured with a radiation thermometer, for example.

The surface temperature of the outermost filter disposed close to the object to be dried (filter 28 in the examples of FIGS. 13 and 14) is preferably 200° C. or less, more preferably 150° C. or less to reduce secondary radiation caused by absorption of infrared light by the filter itself. The surface temperature of the outermost filter can be controlled by flowing air between the two or more filters disposed.

In the IR drying unit 230, the drying region can be composed of (coated with) a material highly reflective to infrared light, efficiently utilizing the infrared light not absorbed by the object to be dried.

As illustrated in FIGS. 13 and 14, the infrared heater 20 is connected to a cooling mechanism 40 to circulate the coolant through the hollow portion 30. The cooling mechanism 40 and the filament 22 are connected to a controller 50. In such a control circuit, the controller 50 controls the volume of the coolant to be fed to the hollow portion 30 from the cooling mechanism 40 and the temperature of the heat generated by the filament 22.

As illustrated in FIG. 12, the photo-curing unit 240 includes transfer rollers 242 and a UV applicator 244. In the photo-curing unit 240, the coating solution dried through irradiation with infrared light is irradiated with ultraviolet light from a UV applicator 244 to be cured, in the midway while the transparent substrate is being transferred through transfer rollers 242.

In the photo-curing unit 240, an electron beam irradiating apparatus can be preferably used instead of the UV applicator 244.

The "ultraviolet light" particularly preferably used is ultraviolet light (UV light) having a wavelength of 150 nm to 230 nm.

The intensity of the radiated ultraviolet light and/or the irradiation time are set in the range not damaging the substrate carrying the coating matter to be irradiated. In a substrate of a plastic film, preferably the distance between the substrate and a lamp is set such that the intensity on the surface of the substrate is 10 to 300 mW/cm$^2$ and the coating matter is irradiated for 0.1 seconds to 10 minutes, preferably 0.5 seconds to 3 minutes.

The UV applicator can be a commercially available lamp (made by Ushio Inc., for example).

The ultraviolet light can be preferably used because the ultraviolet light has larger energy than the interatomic bonding forces of most of the substances and can directly cut the atomic bonds by the action of only photons called photon processing. This action can efficiently reform compounds at low temperature without hydrolysis.

Specific examples of the ultraviolet light sources of the UV applicator 244 for performing the photon processing include noble gas excimer lamps emitting ultraviolet light having a wavelength in the range of 100 to 230 nm.

The atoms of noble gases, such as Xe, Kr, Ar, and Ne, do not form molecules via chemical bonding, and these gases are referred to as inert gases; however, the atoms (excited atoms) of the noble gases given energy by discharge can be bonded to other atoms to form molecules.

In an example when the noble gas is xenon (Xe), excimer light at 172 nm is emitted when an excited excimer molecule $Xe_2^*$ transits to the ground state as shown in the following reaction formulae:

$$e + Xe \rightarrow Xe^*$$

$$Xe^* + 2Xe \rightarrow Xe_2^* + Xe$$

$$Xe_2^* \rightarrow Xe + Xe + h\nu (172 \text{ nm})$$

The excimer lamp has high efficiency because the excimer lamp mainly radiates at a single wavelength while barely emitting unnecessary light having wavelengths other than the single wavelength. The excimer lamp can keep the target object at a relatively low temperature without emitting unnecessary light. The excimer lamp can be instantaneously turned on/off because it starts and restarts quickly.

Examples of the light sources for efficiently radiating excimer light include dielectric bather discharge lamps.

The dielectric bather discharge lamp generates electrical discharge between two electrodes separated by a dielectric substance, and typically includes a discharge container composed of a dielectric substance and at least one of the electrodes externally disposed on the discharge container. In an exemplary dielectric bather discharge lamp, a double cylindrical discharge container is composed of inner and outer quartz tubes, and contains a noble gas, such as xenon. The discharge container includes a first net electrode externally disposed thereon and a second electrode disposed inside the inner tube. The dielectric bather discharge lamp generates dielectric bather discharge inside the discharge container in response to high frequency voltage applied between these electrodes, and generates excimer light during dissociation of the excimer molecules, such as xenon, generated by the discharge.

The excimer lamp can emit light at high efficiency and thus at low electric power. The excimer lamp radiates energy in the ultraviolet light region at a single wavelength without emission of long-wavelength light, which heats the target object; hence, the excimer lamp prevents the target object from being heated by the incident light.

Excimer light emission is attained by dielectric barrier discharge. The dielectric bather discharge refers to thunder-like microdischarge generated in a gaseous space between electrodes separated by a dielectric substance (transparent quartz in the excimer lamp) through application of a high frequency voltage of tens of kilohertz to the electrodes. The microdischarge disappears if streamers of the microdischarge reach the wall of the tube (dielectric substance) to accumulate charges on the surface of the dielectric substance.

This microdischarge spreads over the wall of the tube, and repeatedly appears and disappears. Such microdischarge generates flickering of light visible to the naked eye. Streamers at very high temperatures locally and directly reach the wall of the tube, so that the wall of the tube may be quickly degraded.

Besides dielectric bather discharge, excimer emission can also be efficiently attained by electrodeless discharge. The electrodeless discharge or radio-frequency (RF) discharge is caused by capacitive coupling. The electrodeless discharge may use the same configuration composed of the same lamp and the same electrodes used in the dielectric bather discharge. The lamp is activated on in response to a high frequency of several megahertz applied between the electrodes. The electrodeless discharge attains such spatially and temporally homogenous discharge to ensure a prolonged service life of the lamp without flickering.

In dielectric bather discharge, microdischarge occurs only between the electrodes. To generate discharge in the overall discharging space, the outer surface of the discharge container should be completely covered with the outer electrode composed of a light transmissive material to extract light to the outside.

For this purpose, the electrode used in dielectric bather discharge is in the form of a net composed of a thin metal wire. The metal wire of the net electrode should be as thin as possible not to block light. Such a net electrode is readily damaged by ozone generated by ultraviolet light in an oxygen atmosphere.

To prevent such damage, the surrounding region of the lamp, namely, the inside of the irradiation apparatus containing the lamp should be placed under an atmosphere of an inert gas, such as nitrogen, and a window composed of synthetic quartz should be provided to extract radiant light. The window composed of synthetic quartz is an expensive consumable part, and causes loss of light.

In a double cylindrical lamp having an outer diameter of about 25 mm, the difference in the traveling distance from the surface of the lamp to the target surface under the lamp is significantly large between the lights perpendicularly incident on the target surface and the lights obliquely incident on the target surface, causing a great difference in illuminance. No homogenous illuminance distribution is also attained even if the lamps are closely aligned. An irradiating apparatus equipped with a window composed of synthetic quartz can provide a fixed radiation distance of the lights in the oxygen atmosphere to attain a homogenous illuminance distribution.

No external net electrode is required in an electrodeless discharge mode. An external electrode can be disposed on part of the outer surface of the lamp to attain glow discharge spreading over the entire discharging space. Typically, the external electrode composed of an aluminum block and also serving as a light-reflecting plate is disposed on the back of the lamp. The lamp has a large outer diameter as in the lamp in the dielectric bather discharge mode, and needs a synthetic-quartz window to attain a homogenous illuminance distribution.

A thin tubular excimer lamp has a simple structure. The thin tubular excimer lamp is composed of only a quartz tube having closed ends and a gas for excimer emission encapsulated inside the tube.

The thin tubular excimer lamp has an outer diameter of about 6 nm to 12 mm. A lamp having a significantly large outer diameter needs high starting voltage.

The thin tubular excimer lamp can discharge in a dielectric bather discharge mode or an electrodeless discharge mode. The thin tubular excimer lamp may have an electrode having a flat surface in contact with the lamp. An electrode having a curved surface along the lamp can firmly fix the lamp, and be in tight contact with the lamp to continue stable discharge. A mirror electrode having a curved surface finished with aluminum also serves as a light-reflecting plate.

A xenon excimer lamp, which radiates ultraviolet light having a single short wavelength of 172 nm, has high luminescence efficiency. This ultraviolet light has a large absorption coefficient to oxygen, and can generate a high concentration of radical atomic oxygen species and ozone from a slight amount of oxygen.

The ultraviolet light having a short wavelength of 172 nm has high energy which can dissociate bonds of organic substances.

The activated oxygen or ozone and high energy of ultraviolet light radiation can achieve a reaction in a short time.

Accordingly, the ultraviolet light having a higher throughput than those of light of low pressure mercury lamps and plasma emitting light at wavelengths of 185 nm and 254 nm, respectively, can shorten the treatment time, can reduce the facility in size, and can be applied to irradiation of organic materials and plastic substrates susceptible to thermal degradation.

The excimer lamp can generate light at high efficiency and thus can be activated at low electricity. The excimer lamp radiates energy in the ultraviolet light region at a single wavelength without emitting long wavelength light, which heats the target object; hence, the excimer lamp prevents the target object from being heated by the light emitted onto the object. Such advantages of ultraviolet light are suitable for flexible film materials, such as PET.

Higher irradiation intensity can increase the probability of photon bombardment on chemical bonds of compounds in the coating solution to shorten the time for a reforming reaction. Higher irradiation intensity can also increase the number of photons intruding into the target layer to increase the modifiable thickness of the target layer to be reformed and/or enhance the quality (density) of the layer.

A significantly long irradiation time may damage the flatness of the target layer or other materials. The progress of the reaction is usually controlled based on the accumulated light amount expressed as a product of the irradiation intensity by the irradiation time; however, the absolute value of the irradiation intensity may be important in materials having the same composition but different structures, such as silicon oxide.

<<Irradiation Intensity of Ultraviolet Light>>

Accordingly, it is preferred in the photo-curing unit 240 that a reforming treatment with ultraviolet light be performed at least once at a maximum irradiation intensity of 100 to 200 mW/cm$^2$ to prevent damage of the substrate, the lamp, and lamp accessories.

<<Irradiation Time of Ultraviolet Light>>

Irradiation with ultraviolet light can be performed for any period of time. To prevent damage of the substrate and defects generated in one or more layers on the substrate, the time for the irradiation step at high illuminance is preferably 0.1 seconds to 3 minutes, more preferably 0.5 seconds to 1 minute.

<<Oxygen Level During Irradiation with Ultraviolet Light>>

The oxygen level during irradiation with vacuum ultraviolet light (VUV) is preferably 500 to 10000 ppm (1%), more preferably 1000 to 5000 ppm.

An oxygen level controlled within this range does not significantly prolong the time for replacement of an atmosphere in a vacuum ultraviolet light (VUV) irradiation chamber with the air. An oxygen level within this range can also prevent an increase in the amount of air (including oxygen) intruding into the vacuum ultraviolet light (VUV) irradiation chamber through web transfer in continuous production using a roll-to-roll process and the resulting unsuccessful control of the oxygen level.

The present inventor, who has conducted research, has found that oxygen and a slight amount of moisture are spontaneously mixed with the coating solution during application thereof, and the transparent substrate also has adsorbed oxygen and water. The inventor has concluded that the vacuum ultraviolet light (VUV) irradiation chamber already has a sufficient oxygen source essential for the reforming reaction without additional feed of oxygen.

In irradiation with VUV light in an atmosphere containing a large amount (several percent) of oxygen gas, the coating solution disadvantageously contains excess oxygen.

As described above, oxygen absorbs the vacuum ultraviolet light (VUV) at 172 nm to reduce the amount of the vacuum ultraviolet light (VUV) at 172 nm reaching the surface of the coating solution, and in turn the efficiency of the treatment.

Namely, the irradiation with vacuum ultraviolet light (VUV) is preferably performed in a minimum oxygen level so that VUV light is efficiently incident on the coating matter.

This control of the oxygen level is specific to the coating process under atmospheric pressure to form and reform a precursor layer, and significantly differs from an atomic deposition process to deposit a composition containing components in a preliminarily controlled proportion to form a layer, such as chemical vapor deposition (CVD).

In the irradiation with vacuum ultraviolet light (VUV), gases other than oxygen are preferably dry inert gases, in particular dry nitrogen gas in view of cost. The oxygen level can be controlled by measuring the flow rates of the oxygen gas and the inert gas to be introduced into the irradiation chamber and varying the ratio of these flow rates.

As illustrated in FIG. 12, the inkjet coating unit 250 has the same configuration and function as those of the inkjet coating unit 220. A coating solution from an inkjet head 256 is applied onto a transparent substrate supported on a platen 254 into a predetermined pattern in the midway while the transparent substrate is being transferred through transfer rollers 252.

The IR drying unit 260 has the same configuration and function as those of the IR drying unit 230. The applied patterned coating solution is irradiated with infrared light from an infrared heater 264 to be dried, in the midway while the transparent substrate is being transferred through transfer rollers 262. The infrared heater 264 is identical to the infrared heater 20.

The photo-curing unit 270 has the same configuration and function as those of the photo-curing unit 240. The coating solution dried through irradiation with infrared light is irradiated with ultraviolet light from an UV applicator 274 to be cured, in the midway while the transparent substrate is being transferred through transfer rollers 272. The UV applicator 274 is the same as the UV applicator 244.

The transfer unit 280 has the same configuration and function as those of the transfer unit 210. The transparent substrate is transferred through transfer rollers 282 under an adjusted tension applied to the transparent substrate, and is wound around the take-up roll 204.

(2) MANUFACTURING METHOD

A light scattering layer 2a is formed on a transparent substrate 13, and a smoothing layer 2b is then formed on the light scattering layer 2a.

(2.1) Light Scattering Layer

In the step of forming the light scattering layer 2a, the light scattering layer 2a is formed mainly through the following steps (i) to (iii):

Step (i): applying a predetermined coating solution onto the transparent substrate 13 into a predetermined pattern, Step (ii): drying the applied patterned coating solution, and Step (iii): curing the dried coating solution.

In Step (i), light scattering particles having an average particle size of 0.2 μm or more and less than 1 μm and a refractive index of 1.7 or more and less than 3.0 are dispersed in a hydroxy-containing solvent to prepare a resin material dispersion. This coating solution is applied onto the transparent substrate 13.

In this case, in the inkjet coating unit 220, the coating solution is applied by inkjet coating into a predetermined pattern.

<<Coating Solution>>

The light scattering particles are dispersed in a matrix resin (polymer) solution (the light scattering particles are insoluble in the solvent), and the resulting coating solution is used.

The light scattering particles are actually polydispersed particles, which are difficult to regularly arrange. Such light scattering particles are not regularly distributed and thus change the direction of light by scattering to enhance outcoupling efficiency irrespective of the local diffraction effect.

Any known resin (binder) can be used in the present invention. Examples of the binder include resin films, such as acrylic esters, methacrylic esters, poly(ethylene terephthalate) (PET), poly(butylene terephthalate), poly(ethylene naphthalate) (PEN), polycarbonates (PCs), polyarylates, poly(vinyl chloride) (PVC), polyethylene (PE), polypropylene (PP), polystyrene (PS), nylon (Ny), aromatic polyamides, polyether ether ketones, polysulfone, polyether sulfones, polyimides, and polyetherimides; a heat-resistant transparent film having a basic skeleton of silsesquioxane having an organic-inorganic hybrid structure (product name: Sila-DEC, made by Chisso Corporation); silane compounds containing a perfluoroalkyl group (such as (heptadecafluoro-1,1,2,2-tetradecyl)triethoxysilane); and fluorine-containing copolymers composed of fluorine-containing monomers and crosslinkable monomers. These resins can be used in combination. Among these resins, preferred are resins having organic-inorganic hybrid structures.

Hydrophilic resins can also be used. The hydrophilic resins include water-soluble resins, water-dispersible resins, colloidal dispersion resins, and mixtures thereof. Examples of the hydrophilic resins include acrylic, polyester, polyamide, polyurethane, and fluorinated resins, and specific examples include polymers, such as poly(vinyl alcohol), gelatin, poly(ethylene oxide), poly(vinyl pyrrolidone), casein, starch, agar, carrageenan, polyacrylic acid, polymethacrylic acid, polyacrylamide, polymethacrylamide, poly(styrenesulfonate), cellulose, hydroxylethyl cellulose, carboxylmethyl cellulose, hydroxylethyl cellulose, dextran, dextrin, pullulan, and water-soluble poly(vinyl butyral). Among these polymers, preferred is polyvinyl alcohol.

These polymers usable for the binder resins can be used alone or in combination.

Known resin particles (emulsions) can also be suitably used.

In addition, resins curable by ultraviolet light or electron beams (i.e., mixtures of ionizing radiation-curable resins, thermoplastic resins, and solvents) and thermosetting resins can also be suitably used as the binder.

Binder resins of this type are preferably polymers having saturated hydrocarbon or polyether in the main chain, and more preferably polymers having saturated hydrocarbon in the main chain.

The binder is preferably crosslinked. The polymers having saturated hydrocarbon in the main chain are preferably prepared through a polymerization reaction of ethylenically unsaturated monomers. The crosslinked binder is preferably prepared with a monomer having two or more ethylenically unsaturated groups.

In the present invention, compounds which can form metal oxides, metal nitrides, or metal oxide nitrides by irradiation with ultraviolet light under a specific atmosphere can be particularly suitably used. The compounds suitable for the present invention are preferably compounds that can be reformed at relatively low temperature, which are described in Japanese Patent Application Laid-Open Publication No. H8-112879.

Specific examples of such compounds include polysiloxanes having Si—O—Si bonds (including polysilsesquioxane), polysilazanes having Si—N—Si bonds, and polysiloxazanes having both Si—O—Si bonds and Si—N—Si bonds. These compounds can be used in combination. Two or more different compounds can be sequentially or simultaneously deposited.

These polysiloxanes (including polysilsesquioxane), polysilazanes, and polysiloxazanes are the same as described in the bather layer of the transparent substrate.

It is should be noted that the solvent used in the coating solution contains hydroxy groups (—OH groups).

A solvent containing —OH groups significantly enhances the dispersion of the light scattering particles (high-refractive index particles), enhances the adhesion of the coating solution to the transparent substrate, and facilitates the application of the coating solution. The outcoupling efficiency is also enhanced although the reason is unclear. In the present invention, a solvent efficiently absorbing light in the infrared wavelength region, which is barely absorbed by the flexible transparent substrate, can achieve high speed drying of the coating solution applied on to the flexible transparent substrate.

The present invention is characterized by a coating solution including a solvent containing —OH groups. The solvent containing —OH groups is contained in a proportion of preferably 10% or more, more preferably 50% or more, still more preferably 60% or more, particularly preferably 70% or more.

In the present invention, the coating solution preferably contains at least one solvent having a boiling point of preferably 120 to 250° C., more preferably 150 to 200° C. Among these solvents, particularly preferred are solvents having boiling points of 150 to 200° C. and containing —OH groups. Preferably, the coating solution does not contain any solvent having a boiling point of 150° C. or more but containing no —OH group. It should be noted that the proportion of such a solvent, if contained in the coating solution, is less than 30%, more preferably less than 20%, particularly preferably less than 10%.

Examples of the solvent containing —OH groups include water, methanol, ethanol, n-propanol, isopropanol, butanol, n-amyl alcohol, sec-amyl alcohol $CH_3CH_2CH_2CH(OH)CH_3$, 3-pentanol $CH_3CH_2CH(OH)CH_2CH_3$, 2-methyl-1-butanol $CH_3CH_2CH(CH_3)CH_2OH$, 3-methyl-1-butanol (isoamyl alcohol) $CH_3CH(CH_3)CH_2CH_2OH$, 2-methyl-2-butanol (tert-amyl alcohol) $CH_3CH_2C(CH_3)_2OH$, 3-methyl-2-butanol $CH_3CH(CH_3)CH(OH)CH_3$, and 2,2-dimethyl-1-propanol. Further examples of the solvents include polyhydric alcohol derivatives, such as ethylene glycol monomethyl ether(methyl cellosolve), ethylene glycol monoethyl ether (ethyl cellosolve), ethylene glycol monobutyl ether (butyl cellosolve), propylene glycol monomethyl ether, propylene glycol monoethyl ether, and propylene glycol monobutyl ether.

Examples of the usable solvent include ethylene glycol monoisopropyl ether, ethylene glycol dimethyl ether, ethylene glycol diethyl ether, ethylene glycol monomethoxymethyl ether, diethylene glycol, diethylene glycol monomethyl ether, diethylene glycol monoethyl ether, diethylene glycol monobutyl ether, triethylene glycol, triethylene glycol monomethyl ether, triethylene glycol monoethyl ether, triethylene glycol monobutyl ether, tetraethylene glycol, tetraethylene glycol monobutyl ether, propylene glycol, propylene glycol monomethyl ether, propylene glycol monoethyl ether, propylene glycol monopropyl ether, propylene glycol monobutyl ether, propylene glycol monomethyl ether acetate, dipropylene glycol, dipropylene glycol monomethyl ether, dipropylene glycol monoethyl ether, dipropylene glycol monopropyl ether, dipropylene glycol monobutyl ether, dipropylene glycol monomethyl ether acetate, tripropylene glycol, tripropylene glycol monomethyl ether, tripropylene glycol monoethyl ether, tripropylene glycol monobutyl ether, 1,3-propanediol, 2-methyl-1,3-propanediol, 2,2-dimethyl-1,3-propanediol, 2-amino-2-methyl-1,3-propanediol, 1,4-butanediol, 1,3-butanediol, 1,2-butanediol, 2,3-butanediol, 3-methyl-1,3-butanediol, 1,2-pentanediol, 1,5-pentanediol, 2-methyl-2,4-pentanediol, 3-methyl-1,5-pentanediol, 1,2-hexanediol, 1,6-hexanediol, 2-ethyl-1,3-hexanediol, 2,5-dimethyl-2,5-hexanediol, polypropylene glycol monomethyl ether, glycerol, monoacetin, trimethylolethane, trimethylol propane, and 2-phenoxyethanol.

Another examples of the solvent usable include 1-butanol, 2-butanol, isobutanol, t-butanol, 3-methoxy-1-butanol, 3-methyl-3-methoxybutanol, 1-pentanol, 1-octanol, 2-octanol, n-nonyl alcohol, tridecyl alcohol, n-undecyl alcohol, stearyl alcohol, oleyl alcohol, benzyl alcohol, 4-hydroxy-2-butanone, diacetone alcohol, monoethanolamine, 2-aminoethanol, N-methylethanolamine, dimethylethanolamine, diethylethanolamine, N-n-butylethanolamine, 2-dibutylaminoethanol, 2-diisopropylaminoethanol, N-methyl-diethanolamine, diethanolamine, 2,2'-(n-ethyl)iminodiethanol, 2,2'-(n-butyl)iminodiethanol, triethanolamine, 2-amino-2-methyl-1-propanol, and 3-amino-1-propanol.

In Step (i), the patterning can be performed by any known printing method. A variety of methods, such as gravure printing, flexo printing, screen printing, microcontact printing, and inkjet printing, can be suitably used. Most preferred is inkjet printing not using any printing plate.

In Step (ii), in the IR drying unit 230, the applied patterned coating solution is dried with an infrared heater 20 through irradiation of infrared light having a proportion of 5% or less of a spectral radiance at a wavelength of 5.8 μm to a spectral radiance at a wavelength of 3.0 μm.

The "infrared light" generally refers to a radiation of light having a wavelength longer than that of visible light.

The infrared light according to the present embodiment has a proportion of 5% or less, preferably 3% or less, more preferably 1% or less, most preferably 0.5% or less of a spectral radiance at a wavelength of 5.8 μm to a spectral radiance at a wavelength of 3.0 μm.

The solvent containing —OH groups preferably used as a solvent for the coating solution has a strong absorption wavelength due to O—H stretching vibration near about 3.0 μm.

In contrast, the transparent substrate preferably used barely has an absorption wavelength in the infrared wavelength region near 3.0 μm while having a strong absorption wavelength in the infrared wavelength region of 5.8 μm or more.

In the present embodiment, the irradiation with the infrared light defined above dries the coating solution without damage of the transparent substrate, attaining the coating solution having enhanced uniformity of the thickness distribution, surface smoothness, and patterning accuracy.

The drying step can be performed on any condition. The irradiation time can be controlled by varying the surface temperatures of the filament 22 and the filters 26 and 28. For example, the drying step can be performed for an irradiation time of 10 seconds to 30 minutes if the temperature of the filament 22 is 450 to 2600° C. (preferably 600 to 1200° C.) and the surface temperatures of the filters 26 and 28 is less than 200° C. (preferably less than 150° C.). Such a drying step achieves a light scattering layer 2a having high uniformity of the thickness distribution and high patterning accuracy.

A preliminary heat treatment may be separately performed before the infrared light irradiation step to the extent of not deforming the transparent substrate.

The preliminary heat treatment can be performed by any method, such as a hot plate, an electric furnace (e.g., a box furnace, a conveyor furnace), a near-infrared heater, a mid-infrared heater, a far-infrared heater, warm air, hot air, or microwaves. These methods can be used alone or in combination.

In Step (ii), the drying region (IR drying unit 230) can also be composed of (coated with) a material highly reflective to infrared light to efficiently use the infrared light not absorbed by the object to be dried.

In the infrared light according to the present embodiment, the proportion of a spectral radiance at a wavelength of 5.8 μm to a spectral radiance at a wavelength of 3.0 μm can be determined by the following method.

With reference to the methods described in NPL 1 (Heisei 17 Nendo Ensekigaisenhitano Houshaenerugiio Kanitekini Hyokasuruhohono Chosakenkyuhokokusho (Year of Heisei 17 Report on Simple Method for Spectral Evaluation of Radiation Energy from Far Infrared Heater, written by The Japan Machinery Federation and Japan Far Infrared Rays Association), NPL 2 (FTIR TALK LETTER vol. 13, written by SHIMADZU Corporation), and others, an radiation output from an infrared heater and a radiation output from a standard black furnace having the same temperature as that of the filament temperature in the infrared heater are measured with a Fourier transform infrared spectrophotometer (FT-IR) to determine the spectral emissivity of the infrared heater.

The radiation spectrum from the black furnace calculated according to Planck's law of radiation is then multiplied by the spectral emissivity of the infrared heater to generate the spectral emission spectrum of the infrared heater. From the spectral emission spectrum, the spectral radiance at a wavelength of 3.0 μm and the spectral radiance at a wavelength of 5.8 μm are read, and the proportion (percentage) of the spectral radiance at a wavelength of 5.8 μm to the spectral radiance at a wavelength of 3.0 μm can be determined by calculation.

In Step (iii), in the photo-curing unit 240, the dried coating solution is irradiated with light to be cured.

The ionizing radiation-curable resin composition as a binder in the coating solution can be cured by a standard process of curing an ionizing radiation-curable resin composition, i.e., irradiation with electron beams or ultraviolet light.

Curing with electron beams is performed with electron beams having an energy of 10 to 1000 keV, preferably 30 to 300 keV emitted from a variety of electron beam accelerators, such as accelerators of a Cockcroft-Walton type, a Van de Graaff type, a resonant type, an insulating core transformer type, a linear type, a dynamitron type, and a high frequency type. Among these accelerators, particularly preferred are electron beams having weak intensity. An electron beam source "EB Engine" made by Hamamatsu Photonics K.K. can be particularly preferably used.

Curing with ultraviolet light can be performed with ultraviolet light emitted from ultra-high pressure mercury lamps, high pressure mercury lamps, low pressure mercury lamps, carbon arc lamps, xenon arc lamps, and metal halide lamps. Preferred is use of ultraviolet light from an excimer lamp as described above.

(2.2) Smoothing Layer

In the step of forming the smoothing layer 2b, the smoothing layer 2b is formed through Steps (iv) to (vi) similarly to the formation of the light scattering layer 2a.

Step (iv): applying a predetermined coating solution onto a transparent substrate 13 into a predetermined pattern in the inkjet coating unit 250, Step (v): drying the applied patterned coating solution in the IR drying unit 260, and Step (vi): curing the dried coating solution in the photocuring unit 270.

Step (iv) can be performed with the same coating solution as in Step (i) described above. A coating solution having the same composition can be used in Steps (i) and (iv), or a coating solution having different compositions can be used in Steps (i) and (iv).

In the formation of the internal light extracting layer, Steps (iii) and (vi) (curing) are not always essential, and one or both of Steps (iii) and (vi) may be omitted.

<Transparent Metal Electrode 1>

As illustrated in FIG. 1, the transparent metal electrode 1 has a two-layer structure of a laminate of an undercoat layer 1a and an electrode layer 1b sequentially disposed on the transparent substrate 13. Among these layers, the electrode layer 1b is composed of silver or an alloy mainly composed of silver, and the undercoat layer 1a is composed of a compound containing a nitrogen atom, for example.

The transparency of the transparent metal electrode 1 indicates that the transmittance of light at a wavelength of 550 nm is 50% or more.

(1) UNDERCOAT LAYER

The undercoat layer 1a is disposed on the transparent substrate 13 side of the electrode layer 1b. The undercoat layer 1a can be prepared with any material to inhibit aggregation of silver particles during formation of the electrode layer 1b composed of silver or an alloy mainly composed of silver. Examples of such a material include compounds containing a nitrogen atom.

In an undercoat layer 1a composed of a low-refractive index material (refractive index: less than 1.7), the upper limit of the thickness should be less than 50 nm, and is preferably less than 30 nm, more preferably less than 10 nm, particularly preferably less than 5 nm. A thickness of less than 50 nm minimizes optical loss. The lower limit of the thickness should be 0.05 nm or more, and is preferably 0.1 nm or more, particularly preferably 0.3 nm or more. A thickness of 0.05 nm or more can attain a homogenous undercoat layer 1a to uniformly inhibit aggregation of silver particles.

In an undercoat layer 1a composed of a high-refractive index material (refractive index: 1.7 or more), the thickness has any upper limit, and the lower limit of the thickness is the same as in the low-refractive index material.

Only one requirement for the undercoat layer 1a is that a selected thickness of the undercoat layer attains a homogenous layer.

In another preferred aspect, the undercoat layer 1a also serves as the smoothing layer 1b. In this case, two requirements for design of the undercoat layer 1a should be compatible, that is, a material for the undercoat layer can ensure the surface smoothness required for the smoothing layer 1b and simultaneously can demonstrate the function as the undercoat layer 1a of the electrode.

In this case, the configuration of the internal light extracting layer 2 and the transparent metal electrode 1 can be composed of the light scattering layer 2a, the undercoat layer 1a, and the electrode layer 1b sequentially disposed on the transparent substrate 13 (no smoothing layer 2b), or can be composed of the light scattering layer 2a, the smoothing layer 2b, the electrode layer 1b, and the undercoat layer 1a sequentially disposed on the transparent substrate 13 (not illustrated).

In the configuration composed of a monolayer of the undercoat layer 1a also functioning as the smoothing layer 1b, the undercoat layer 1a preferably has a thickness of the smoothing layer 1b. Examples of the method of forming the undercoat layer 1a include wet processes, such as application, ink jetting, coating, and dipping, and dry processes, such as deposition processes (e.g., resistive heating deposition and electron beam (EB) deposition), sputtering, and chemical vapor deposition (CVD). Among these processes, preferably used are deposition processes.

The undercoat layer 1a can be prepared with any compound containing a nitrogen atom in the molecule. Preferred is a compound having a heterocycle containing a nitrogen heteroatom. Examples of the heterocycle containing a nitrogen heteroatom include aziridine, azirine, azetidine, azete, azolidine, azole, azinane, pyridine, azepane, azepine, imidazole, pyrazole, oxazole, thiazole, imidazoline, pyrazine, morpholine, thiazine, indole, isoindole, benzoimidazole, purine, quinoline, isoquinoline, quinoxaline, cinnoline, pteridin, acridine, carbazole, benzo-C-cinnoline, porphyrin, chlorin, and corrin.

(2) ELECTRODE LAYER

The electrode layer 1b is composed of silver or an alloy mainly composed of silver, and is disposed on the undercoat layer 1a.

Examples of the method of forming such an electrode layer 1b include wet processes, such as application, ink jetting, coating, and dipping, and dry processes, such as deposition processes (e.g., resistive heating deposition and electron beam (EB) deposition), sputtering, and chemical vapor deposition (CVD). Among these processes, preferably used are deposition processes.

Although the electrode layer 1b deposited on the undercoat layer 1a has sufficient conductivity without annealing at high temperature after deposition, the deposited electrode layer 1b may be annealed at high temperature after deposition if necessary.

Examples of the alloy mainly composed of silver (Ag) and forming the electrode layer 1b include silver magnesium (AgMg), silver copper (AgCu), silver palladium (AgPd), silver palladium copper (AgPdCu), and silver indium (AgIn).

Such an electrode layer 1b may have a laminate composed of two or more sublayers composed of silver or an alloy mainly composed of silver if necessary.

Preferably, the electrode layer 1b has a thickness ranging from 4 to 9 nm. A thickness of less than 9 nm decreases the absorption or reflection of the light components and thus increases the transmittance of the transparent metal electrode. A thickness of more than 4 nm can sufficiently ensure the conductivity of the electrode layer.

The transparent metal electrode 1 has such a laminate structure composed of the undercoat layer 1a and the electrode layer 1b disposed thereon. The transparent metal electrode 1 may include a protective film and/or an additional electrode layer disposed over the electrode layer 1b. In this case, the protective film and the additional electrode layer preferably have light transmittance so as not to impair the light transmittance of the transparent metal electrode 1.

(3) ADVANTAGEOUS EFFECTS OF TRANSPARENT METAL ELECTRODE

The transparent metal electrode 1 having such a configuration includes an undercoat layer 1a composed of a compound containing a nitrogen atom, and an electrode layer 1b composed of silver or an alloy mainly composed of silver and disposed on the undercoat layer 1a. In such a configuration, silver atoms in the electrode layer 1b interact with the compound containing a nitrogen atom in the undercoat layer 1a during formation of the electrode layer 1b on the undercoat layer 1a to reduce the diffusion distance of the silver atoms on the surface of the undercoat layer 1a, preventing aggregation of silver particles.

Typically, in the formation of an electrode layer 1b mainly composed of silver, a thin film grows in an island (Volumer-Weber: VW) growth mode, in which silver particles are readily isolated in the form of islands. These islands cause technical difficulties in formation of a thin conductive electrode layer and increase the sheet resistance of the resulting layer. To ensure the conductivity, the layer should have a greater thickness while such a thicker layer reduces the light transmittance of the layer. In consequence, the resulting transparent metal electrode is not suitable.

In contrast, the transparent metal electrode 1 prevents aggregation of silver particles on the undercoat layer 1a as described above; hence, a thin film of the electrode layer 1b composed of silver or an alloy mainly composed of silver grows in Frank-van der Merwe (FM) mode.

Throughout the specification, the transparency of the transparent metal electrode 1 indicates that the light transmittance at a wavelength of 550 nm is 50% or more. The undercoat layer 1a composed of the material described above has sufficiently high light transmittance compared with the electrode layer 1b composed of silver or an alloy mainly composed of silver. The conductivity of the transparent metal electrode 1 is mainly ensured by the electrode layer 1b. Consequently, a reduced thickness and ensured conductivity of the electrode layer 1b composed of silver or an alloy mainly composed of silver can achieve an enhancement in the conductivity of the transparent metal electrode 1 and an enhancement of the light transmittance at the same time.

<Luminous Functional Layer 3>

The luminous functional layer 3 includes at least a luminous layer 3c.

The luminous layer 3c used in the present invention contains a phosphorescent compound as a luminous material. The luminous material used may be a fluorescent material, or may be a combination of a phosphorescent compound and a fluorescence material.

The luminous layer 3c emits light through recombination of electrons injected from the electrode or the electron transporting layer 3d with holes injected from the hole transporting layer 3b. The luminous portion may be disposed inside the luminous layer 3c or at the interface between the luminous layer 3c and its adjacent layer(s).

Such a luminous layer 3c can have any configuration containing a luminous material that satisfies the requirement on light emission. The luminous layer 3c may be composed of several luminous sublayers having the same light emission spectrum or the same local maximum wavelength. In this case, a non-luminous intermediate sublayer (not illustrated) is preferably disposed between adjacent luminous sublayers.

The total thickness of the luminous layer 3c is preferably within the range of 1 to 100 nm, more preferably 1 to 30 nm to achieve lower start voltage.

If the luminous layer 3c is composed of the luminous sublayers and the non-luminous intermediate sublayers, the total thickness of the luminous layer 3c includes the thicknesses of the non-luminous sublayers.

In the multi-layered luminous layer 3c, the thickness of the luminous sublayer is preferably controlled within the range of 1 to 50 nm, more preferably 1 to 20 nm. If the laminated luminous sublayers emit lights of colors of blue, green, and red, respectively, the thicknesses of the blue, green, and red luminous sublayers can have any relationship.

Such a luminous layer 3c can be prepared with a known luminous material or host compound by a known process of forming a thin film, such as vacuum evaporation, spin coating, casting, Langmuir-Blodgett (LB) coating, or ink jetting.

The luminous layer 3c can contain several luminous materials, or can contain a mixture of a phosphorescent material and a fluorescent material (also referred to as fluorescent dopant or fluorescent compound).

Preferably, the luminous layer 3c contains a host compound (also referred to as luminous host) and a luminous material (also referred to as luminous dopant) to emit light from the luminous material.

<Counter Electrode 5a>

The counter electrode 5a is in the form of a film functioning as a cathode feeding electrons to the luminous functional layer 3, and is composed of a conductive material, such as a metal, an alloy, an organic or inorganic conductive compound, or a mixture thereof. Specific examples of the conductive material include aluminum, silver, magnesium, lithium, magnesium/copper mixtures, magnesium/silver mixtures, magnesium/aluminum mixtures, magnesium/indium mixtures, indium, lithium/aluminum mixtures, rare earth element metals, and oxide semiconductors, such as ITO, ZnO, $TiO_2$, and $SnO_2$.

The counter electrode 5a can be prepared through deposition or sputtering of these conductive materials into a thin film. The sheet resistance of the counter electrode 5a is preferably several hundred SI/square or less, and the thickness is selected within the range of typically 5 nm to 5 μm, preferably 5 to 200 nm.

If the organic light emitting element 10 also extracts the luminescent light h from the counter electrode 5a, a conductive material having high light transmittance may be selected from the conductive materials described above to form the counter electrode 5a.

<Extraction Electrode 16>

The extraction electrode 16 electrically connects the transparent metal electrode 1 to an external power supply. The extraction electrode 16 can be composed of any suitable material, for example, a metal film, such as an MAM electrode having a three-layer structure (Mo/Al.Nd alloy/Mo).

<Auxiliary Electrode 15>

The auxiliary electrode 15 is disposed on the electrode layer 1b of the transparent metal electrode 1 to reduce the resistance of the transparent metal electrode 1. Preferred materials for forming the auxiliary electrode 15 are metal materials having low resistance, such as gold, platinum, silver, copper, and aluminum. These metals have low light transmittance, and are formed in a pattern in the range not affecting the extraction of the luminescent light h from an outcoupling surface 13a.

Examples of the method of forming such an auxiliary electrode 15 include deposition, sputtering, printing, ink jetting, and aerosol jetting. The auxiliary electrode 15 preferably has a line width of 50 μm or less in view of an opening rate to extract light. The auxiliary electrode 15 preferably has a thickness of 1μ or more in view of conductivity.

<Sealing Material 17>

The sealing material 17 covers the organic light emitting element 10, and may be a sealing plate (or film) fixed to the transparent substrate 13 with an adhesive 19 or may be a sealing membrane. The sealing material 17 is disposed such that the terminals of the transparent metal electrode 1 and the counter electrode 5a in the organic light emitting element 10 are exposed and at least the luminous functional layer 3 is covered with the sealing material 17. The sealing material 17 may include an electrode electrically conducting the terminals of the transparent metal electrode 1 and the counter electrode 5a of the organic light emitting element 10.

Specific examples of a plate (film) sealing material 17 include glass substrates, polymer substrates, and metal substrates. These substrate materials may be formed into thinner films for use. Examples of the glass substrates include soda lime glass, barium-strontium-containing glass, lead glass, aluminosilicate glass, borosilicate glass, barium borosilicate glass, and quartz. Examples of the polymer substrates include polycarbonates, acrylates, poly(ethylene terephthalate), poly(ether sulfide), and polysulfone. Examples of the metal substrates include one or more metals selected from the group consisting of stainless steel, iron, copper, aluminum, magnesium, nickel, zinc, chromium, titanium, molybdenum, silicon, germanium, and tantalum or alloys thereof.

Among these substrates, preferably usable substrates as sealing materials are thin films of polymer substrates and metal substrates to attain a thin organic light emitting element.

More preferably, a polymer substrate in the form of a film has an oxygen permeation rate of $1 \times 10^{-3}$ ml/(m$^2$·24 h·atm) or less determined by the method in accordance with JIS K 7126-1987 and a steam permeation rate (25±0.5° C., relative humidity: (90±2)% RH) of $1 \times 10^{-3}$ g/(m$^2$·24 h) or less determined by the method in accordance with JIS K 7129-1992.

Such a substrate material may be processed into an embossed plate for use as the sealing material 17. In this case, the substrate material is processed by sandblasting or chemical etching to form depressions on the surface of the substrate.

The adhesive 19 for fixing a plate sealing material 17 to the transparent substrate 13 is used as a sealing agent to seal the organic light emitting element 10 interposed between the sealing material 17 and the transparent substrate 13. Specific examples of the adhesive 19 include photo-curable and thermosetting adhesives of acrylic oligomers and methacrylic oligomers having a reactive vinyl group; and moisture-curable adhesives, such as 2-cyanoacrylic acid ester.

Examples of such an adhesive 19 include epoxy thermosetting adhesives and chemosetting adhesives (binary systems). Other examples thereof include hot-melt polyamide, polyester, and polyolefin adhesives. Further examples thereof include cationic UV-curable epoxy resin adhesives.

The organic material for the organic light emitting element 10 may be degraded during a heat treatment. Accordingly, the adhesive 19 preferably can be bonded and cured at a temperature between room temperature and 80° C. The adhesive 19 may contain a desiccant dispersed therein.

The adhesive 19 can be applied to the bonding area between the sealing material 17 and the transparent substrate 13 by a process with a commercially available dispenser or by a printing process, such as screen printing.

If gaps are formed between the plate sealing material 17, the transparent substrate 13, and the adhesive 19, it is preferred that an inert gas, such as nitrogen and argon, or an inert liquid, such as fluorohydrocarbon and silicone oil, be injected into the gaps in a gaseous phase and a liquid phase. The gaps may be in vacuum. The gaps also may be filled with a moisture absorbable compound.

Examples of the moisture absorbable compound include metal oxides (such as sodium oxide, potassium oxide, calcium oxide, barium oxide, magnesium oxide, and aluminum oxide), sulfates (such as sodium sulfate, calcium sulfate, magnesium sulfate, and cobalt sulfate), metal halides (such as calcium chloride, magnesium chloride, cesium fluoride, tantalum fluoride, cerium bromide, magnesium bromide, barium iodide, and magnesium iodide), and perchloric acids (such as barium perchlorate and magnesium perchlorate). Suitably used are sulfurates, metal halides, and perchloric anhydrides.

A sealing membrane as the sealing material 17 is disposed over the transparent substrate 13 such that the luminous functional layer 3 in the organic light emitting element 10 is completely covered with the sealing membrane whereas the terminals of the transparent metal electrode 1 and the counter electrode 5a in the organic light emitting element 10 are exposed.

Such a sealing membrane is composed of an inorganic or organic material. In particular, the sealing membrane is composed of a material which prevents intrusion of a substance, such as moisture or oxygen, causing the degradation of the luminous functional layer 3 of the organic light emitting element 10. Examples of such a material include inorganic materials, such as silicon oxide, silicon dioxide, and silicon nitride. To improve the fragility of the sealing membrane, the sealing membrane may have a laminate structure composed of a membrane composed of the inorganic material above and a membrane composed of an organic material.

These membranes can be formed by any process. Examples of the process include vacuum evaporation, sputtering, reactive sputtering, molecular beam epitaxy, cluster ion beaming process, ion plating, plasma polymerization, atmospheric pressure plasma polymerization, plasma CVD, laser CVD, heat CVD, and coating.

<Protective Film, Protective Plate>

A protective film or plate (not illustrated) may be disposed so as to interpose the organic light emitting element 10 and the sealing material 17 between the transparent substrate 13 and the protective film or plate. The protective film or plate mechanically protects the organic light emitting element 10. In particular, such a protective film or plate is preferably disposed for sufficient mechanical protection of the sealing material 17 in the form of a sealing membrane to the organic light emitting element 10.

Examples of the usable protective film or plate include glass plates, polymer plates, polymer films thinner than the polymer plates, metal plates, metal films thinner than the metal plates, polymer membranes, and metal membranes. Among these materials, particularly preferred are polymer films, which are light and thin.

<Method of Manufacturing Organic Light Emitting Element>

With reference to FIG. 1, an exemplary method of manufacturing the organic light emitting element 10 will now be described.

An internal light extracting layer 2 is formed on a transparent substrate 13. An undercoat layer 1a composed of a compound containing a nitrogen atom is then formed on the internal light extracting layer 2 (smoothing layer 2b) in a thickness of 1 µm or less, preferably 10 to 100 nm by an appropriate process, such as deposition.

An electrode layer 1b composed of silver (or an alloy mainly composed of silver) is then formed on the undercoat layer 1a in a thickness of 12 nm or less, preferably 4 to 9 nm by an appropriate process, such as deposition. A transparent metal electrode or anode 1 is prepared. At the same time, an extraction electrode 16 for connection to an external power supply is formed on one end of the transparent metal electrode 1 by an appropriate process, such as deposition.

A hole injecting layer 3a, a hole transporting layer 3b, a luminous layer 3c, an electron transporting layer 3d, and an electron injecting layer 3e are sequentially disposed to form a luminous functional layer 3.

These layers can be formed by a process, such as spin coating, casting, ink jetting, deposition, or printing. To facilitate the formation of a homogenous layer and prevent the generation of pin holes, particularly preferred is vacuum evaporation or spin coating. Alternatively, these layers can be formed by separate processes. In formation of these layers by deposition, although the deposition conditions depend on the type of the compound to be used, generally desired conditions are appropriately selected in the following ranges: boat heating temperature: 50 to 450° C., degree of vacuum: $1 \times 10^{-6}$ to $1 \times 10^{-2}$ Pa, deposition rate: 0.01 to 50 nm/sec, substrate temperature: −50 to 300° C., and thickness: 0.1 to 5 µm.

Preferably, the luminous functional layer 3 is formed such that the luminous functional layer 3 substantially completely overlaps with the internal light extracting layer 2 in cross-sectional view to effectively extract the luminescent light h generated in the luminous functional layer 3 through the internal light extracting layer 2.

After the formation of the luminous functional layer 3, a counter electrode or cathode 5a is formed thereon by any appropriate process, such as deposition or sputtering. The counter electrode 5a is kept insulated from the transparent metal electrode 1 with the luminous functional layer 3, and is formed into a pattern having a terminal drawn from the top of the luminous functional layer 3 to the periphery of the transparent substrate 13. An organic light emitting element 10 is thereby prepared. In the subsequent step, a sealing material 17 is disposed over at least the luminous functional layer 3 so as to expose the terminals of the transparent metal electrode 1 (extraction electrode 16) and the counter electrode 5a in the organic light emitting element 10.

A desired organic light emitting element 10 is thereby prepared on the transparent substrate 13. In such preparation of the organic light emitting element 10, the steps from the formation of the luminous functional layer 3 to the formation of the counter electrode 5a are preferably successively performed in a single vacuum process. Alternatively, the transparent substrate 13 may be extracted from the vacuum atmosphere during the preparation procedure, and may be subjected to a different process. The transparent substrate 13 should be carefully handled under a dry inert gas atmosphere.

The organic light emitting element 10 emits light under a DC voltage of about 2 to 40 V applied between the transparent metal electrode or anode (positive polarity) 1 and the counter electrode or cathode (negative polarity) 5a. An AC voltage can be also applied. The AC voltage to be applied may have any waveform.

<Advantageous Effects of Organic Light Emitting Element>

The organic light emitting element 10 according to the present invention includes the transparent metal electrode 1 having both conductivity and light transmittance, the transparent substrate 13, and the internal light extracting layer 2 disposed therebetween. Such a configuration can reduce optical loss caused by total reflection between the transparent metal electrode 1 and the transparent substrate 13 to enhance the luminescence efficiency of the organic light emitting element 10.

The organic light emitting element 10 includes the transparent metal electrode 1 as an anode, on which the luminous functional layer 3 and the counter electrode or cathode 5a are disposed. Such a configuration can attain light emission at high luminance of the organic light emitting element 10 by a sufficient voltage applied between the transparent metal electrode 1 and the counter electrode 5a, and can enhance the outcoupling efficiency of the luminescent light h from the transparent metal electrode 1 to attain high luminance. This configuration can also reduce the driving voltage for providing a predetermined luminance to prolong the service life.

The present invention will now be described in detail by way of non-limiting Examples.

EXAMPLES

Preparation of Sample of Internal Light Extracting Layer (1) PREPARATION OF TRANSPARENT SUBSTRATE In accordance with Example 1 of Japanese Patent Application Laid-Open Publication No. 2012-116101, a gas barrier layer was formed on a transparent PET substrate (thickness: 125 µm).

Specifically, an UV-curable organic/inorganic hybrid hard coat material OPSTAR Z7535 made by JSR Corporation was applied to one of easy-to-bond surfaces of a polyester film (made by Teijin DuPont Films Japan Limited, ultra-low-heat shrinkable PET Q83, width: 500 mm, thickness: 125 µm) into a coated layer with a dry thickness of 4 µm. Then, the layer was dried and cured at 80° C. for three minutes, with a high pressure mercury lamp at 1.0 J/cm² in under an air atmosphere, to form a bleed-out blocking layer.

In the subsequent step, an UV-curable organic/inorganic hybrid hard coat material OPSTAR Z7501 made by JSR Corporation was applied to the other surface of the resin substrate into a coated layer with a dry thickness of 4 µm.

Then, the layer was dried at 80° C. for three minutes, and was cured with a high pressure mercury lamp at 1.0 J/cm² under an air atmosphere to form a flat layer.

The maximum cross-sectional height Rt(p) of the flat layer was 16 nm in terms of the surface roughness specified in JIS B 0601.

The surface roughness was determined with an atomic force microscope (AFM) SPI3800 DFM made by SII Nano-Technology Inc. Three different regions (10 μm×10 μm) of the flat layer were measured, and the average of the three values for Rt was defined as the surface roughness.

The thickness of the resin substrate was 133 μm.

Next, a coating solution containing an inorganic precursor compound was applied to the surface of the flat layer on the resin substrate with a depressurized extrusion coater such that the thickness of the dried layer was 150 nm. A first gas bather layer was thus formed.

The coating solution containing an inorganic precursor compound was prepared with a mixture of a solution of 20 mass % catalyst-free perhydropolysilazane (AQUAMICA NN120-20 made by AZ Electronic Materials plc) in dibutyl ether and a 20 mass % perhydropolysilazane (AQUAMICA NAX120-20 made by AZ Electronic Materials plc) containing 5 mass % (solid content) amine catalyst in dibutyl ether. The mixture was adjusted such that the content of the amine catalyst was 1% by mass of the solid content, and was diluted with dibutyl ether to prepare a solution of 5 mass % perhydropolysilazane in dibutyl ether.

After the coating solution was applied, the coated layer was dried at 80° C. for 300 seconds under a drying atmosphere (dew point: 5° C.).

After the coated layer was dried, the resin substrate was gradually cooled to 25° C., and the coated layer was reformed through vacuum irradiation with ultraviolet light in a vacuum UV applicator. The vacuum UV applicator was equipped with a light source, which was a xenon excimer lamp having a double-tube structure and emitting vacuum ultraviolet light at 172 nm.

<<Reformer>>

Excimer applicator made by M.D.COM. Inc. (MODEL: MECL-M-1-200, wavelength: 172 nm, gas sealed in the lamp: Xe)

<<Conditions on Reforming>>

Intensity of excimer light: 3 J/cm² (172 nm)
Heating temperature of the stage: 100° C.
Oxygen level in the applicator: 1000 ppm After the coated layer was reformed, the substrate having the first gas bather layer was dried as above, and was reformed under the same conditions again to adjust the dry thickness of the first gas bather layer to 150 nm.

In the subsequent step, a second gas bather layer was formed on the first gas bather layer as in the first gas bather layer to form a PET film having gas bather characteristics.

(2) PREPARATION OF INTERNAL LIGHT EXTRACTING LAYER (2.1) Sample 1

Comparative Example: Heat

A formulation (10 ml) for a coating solution for a light scattering layer (see Composition A in Table 1) was designed such that the ratio of the solid content of a TiO₂ dispersion (JR600A made by Tayca Corporation, refractive index: 2.4, average particle size: 0.25 μm) to the solid content of a resin solution (ED230AL organic/inorganic hybrid resin made by APM) was 70 vol %/30 vol %, the ratio of n-propyl acetate to cyclohexanone (solvents) was 10% by mass/90 mass %, and the solid content was 15 mass %.

Specifically, while a mixture of TiO₂ particles and the solvents was being cooled at normal temperature, the particles were dispersed for 10 minutes with an ultrasonic disperser (UH-50 made by SMT Co., Ltd.) equipped with a microchip step (MS-3 made by SMT Co., Ltd., diameter 3 mm) on the standard condition to prepare a TiO₂ dispersion.

While the TiO₂ dispersion was being stirred at 100 rpm, a resin was gradually added. After the addition of the resin was completed, the resin was mixed for 10 minutes at 500 rpm to prepare a coating solution for a light scattering layer.

The coating solution was filtered through a hydrophobic PVDF filter (made by Whatman PLC, opening: 0.45 μm) to prepare the target dispersion.

The dispersion was applied onto the transparent substrate by spin coating (500 rpm, 30 seconds). The coated layer was quickly dried (80° C., 2 minutes), and was dried with a hot plate (120° C., 60 minutes) to form a light scattering layer having a thickness of 0.5 μm.

In the subsequent step, a formulation (10 ml) for a coating solution for a smoothing layer (see Composition A in Table 1) was designed such that the ratio of the solid content of a TiO₂ nanodispersion (HDT-760T made by Tayca Corporation, refractive index: 2.4, average particle size: 0.02 μm) to the solid content of a resin solution (ED230AL organic/inorganic hybrid resin made by APM Inc.) was 45 vol %/55 vol %, the ratio of n-propyl acetate/cyclohexanone/toluene (solvents) was 20 mass %/30 mass %/50 mass %, and the solid content was 15 mass %.

In detail, while a mixture of the TiO₂ nanodispersion and the solvents was being stirred at 100 rpm, the resin was gradually added. After the addition of the resin was completed, the resin was mixed for 10 minutes at 500 rpm to prepare a coating solution for a smoothing layer.

Then, the coating solution was filtered through a hydrophobic PVDF filter (made by Whatman PLC, opening: 0.45 μm) to prepare the target dispersion.

The dispersion was applied onto the light scattering layer by spin coating (500 rpm, 30 seconds). Then the coated layer was quickly dried (80° C., 2 minutes), and was dried with a hot plate (120° C., 30 minutes) to form a smoothing layer having a thickness of 0.7 μm. An internal light extracting layer was thus prepared.

The smoothing layer had a refractive index of 1.85.

The internal light extracting layer had a transmittance T of 67% and a haze value Hz of 50%.

The internal light extracting layer was measured with an ellipsometer made by SOPRA SA. in accordance with D542. The entire internal light extracting layer had a refractive index of 1.85 at a wavelength of 550 nm.

In Sample 1, although a higher drying temperature than that described above can mildly shorten the drying time, the reduction in the drying time is not significantly large as in Sample 2. In addition, a higher drying temperature impairs the flatness of the substrate for an organic light emitting element to reduce the commodity value, and damages the bather characteristics of the bather film due to heat shrinkage of the transparent substrate. In an actual process of preparing an organic light emitting element including a bather film, not only heat but also tension is applied. Tension more remarkably and seriously affects the bather film than heat. Consequently, this process is not actually applicable.

(2.2) Sample 2

Comparative Example: Heat

A formulation (10 ml) for a coating solution for a light scattering layer (see Composition B in Table 1) was designed such that the ratio of the solid content of a TiO$_2$ dispersion (JR600A made by Tayca Corporation, refractive index: 2.4, average particle size: 0.25 μm) to the solid content of a resin solution (ED230AL organic/inorganic hybrid resin made by APM Inc.) was 70 vol %/30 vol %, the ratio of hexylene glycol/propylene glycol monomethyl ether/isopropyl alcohol (solvents) was 30 mass %/50 mass %/20 mass %, and the solid content was 15 mass %.

A formulation (10 ml) for a coating solution for a smoothing layer (see Composition B in Table 1) was designed such that the ratio of the solid content of a TiO$_2$ nanodispersion (HDT-710T made by Tayca Corporation, refractive index: 2.4, average particle size: 0.02 μm) to the solid content of a resin solution (ED230AL organic/inorganic hybrid resin made by APM Inc.) was 45 vol %/55 vol %, the ratio of hexylene glycol/propylene glycol monomethyl ether/isopropyl alcohol (solvents) was 30 mass %/50 mass %/20 mass %, and the solid content was 15 mass %.

Except these, Sample 2 was prepared as in Sample 1.

(2.3) Evaluation of Compositions A and B

(2.3.1) Dispersion

The solutions immediately after dispersion and the solutions left to stand at normal temperature for three days were stirred with a stirrer at 300 rpm for one hour, and a variation in particle size of the particles in the redispersed solutions was measured.

The results are shown in Table 1.

A variation in particle size of 5% or less was rated as good (Good), and that in particle size of more than 5% was rated as bad (No Good).

(2.3.2) Ejection Stability by Ink Jetting

Compositions A and B were evaluated for the ejection stability by ink jetting instead of spin coating.

The results are shown in Table 1.

Figure 15:
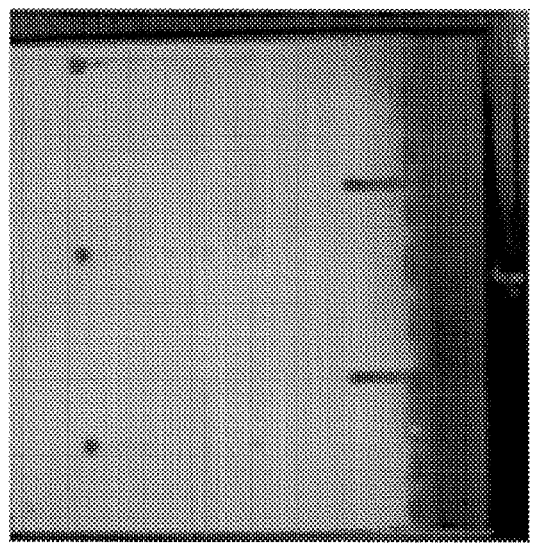
FIG. 15 illustrates an exemplary state of ink jetting when the ejection stability is evaluated as good.
Figure 16:
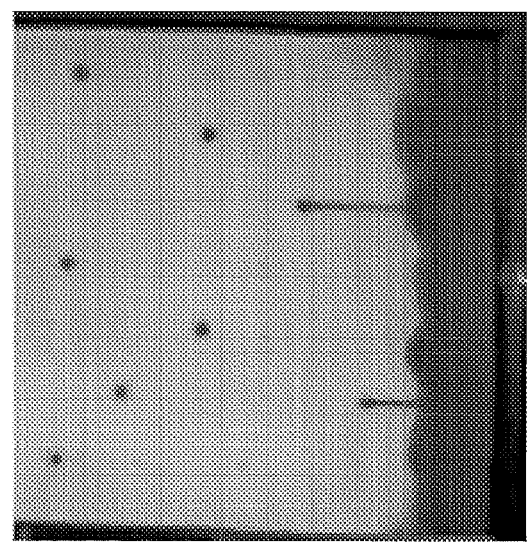
FIG. 16 illustrates an example state of ink jetting where the ejection stability is evaluated as not good.

High ejection stability was rated as "GOOD (see FIG. 15)" and low ejection stability was rated as "No Good (see FIG. 16)".

The compositions were diluted with solvents without changing the compositional ratios. The coated layer having a wet thickness of 10 μm was adjusted to have a desired dry thickness.

The ejection by ink jetting was controlled with a desktop robot Shotmaster-300 (made by Musashi Engineering Inc.) equipped with an inkjet head KM1024LHB (made by Konicaminolta LI Technologies, Inc.) in an inkjet evaluator EB150 (made by Konicaminolta U Technologies, Inc.). The conditions on ejection were set as follows.

<<Conditions on Ejection>>

Head: 42 pl

Drive frequency: 7.6 kHz

Drive voltage: 10 V

Viscosity of the solution: 2-5 cp

(2.3.3) Wettability

Compositions A and B were ejected by an ink jet process instead of a spin coating process on the same ejection conditions as in the evaluation of the ejection stability by an ink jet process to draw images of lines, and the images were observed with an optical microscope to evaluate wettability.

The results are shown in Table 1.

Figure 17:
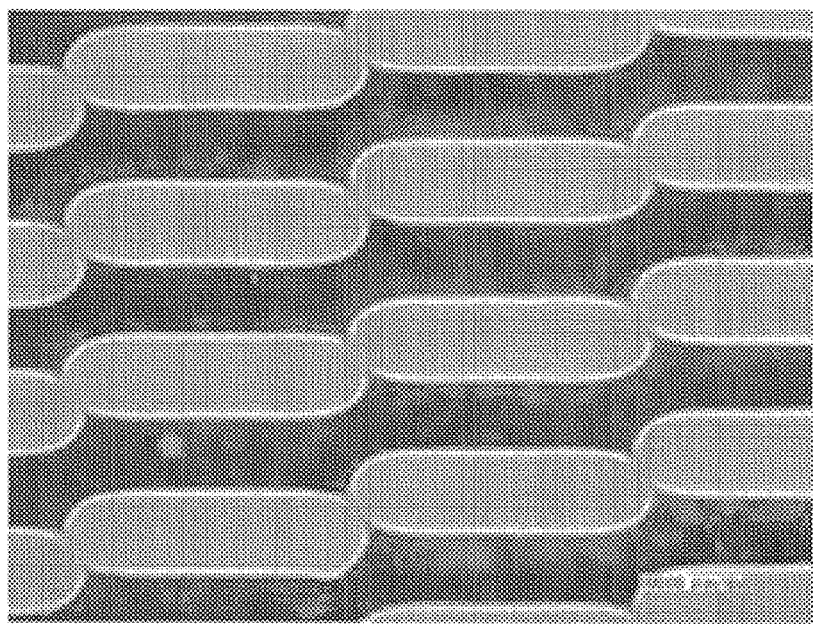
FIG. 17 illustrates an exemplary image of lines observed with an optical microscope, in which the lines are drawn for evaluation of wettability of an ejected object and the wettability is evaluated as good.
Figure 18:
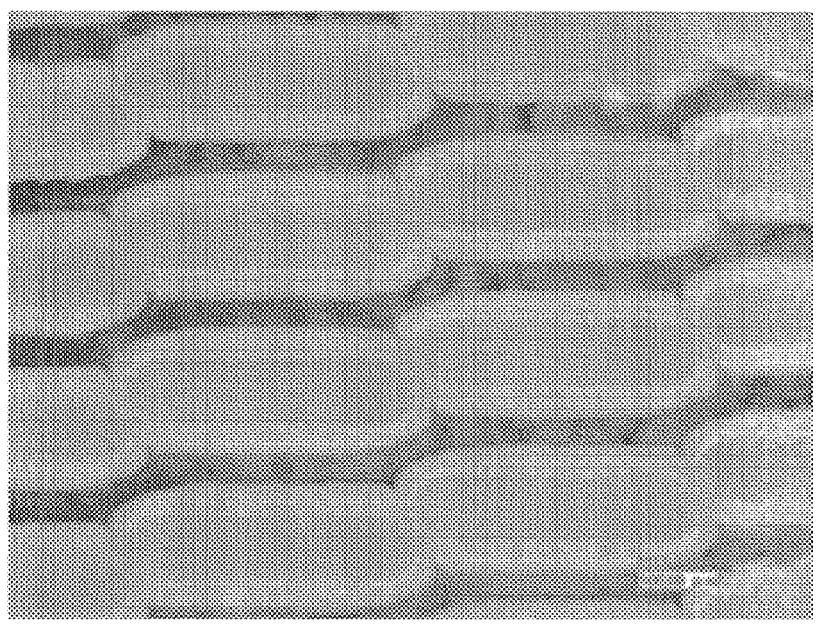
FIG. 18 illustrates an example image of lines observed with an optical microscope, in which the lines are drawn for evaluation of wettability of an ejected object and the wettability is evaluated as not good.
Figure 19:
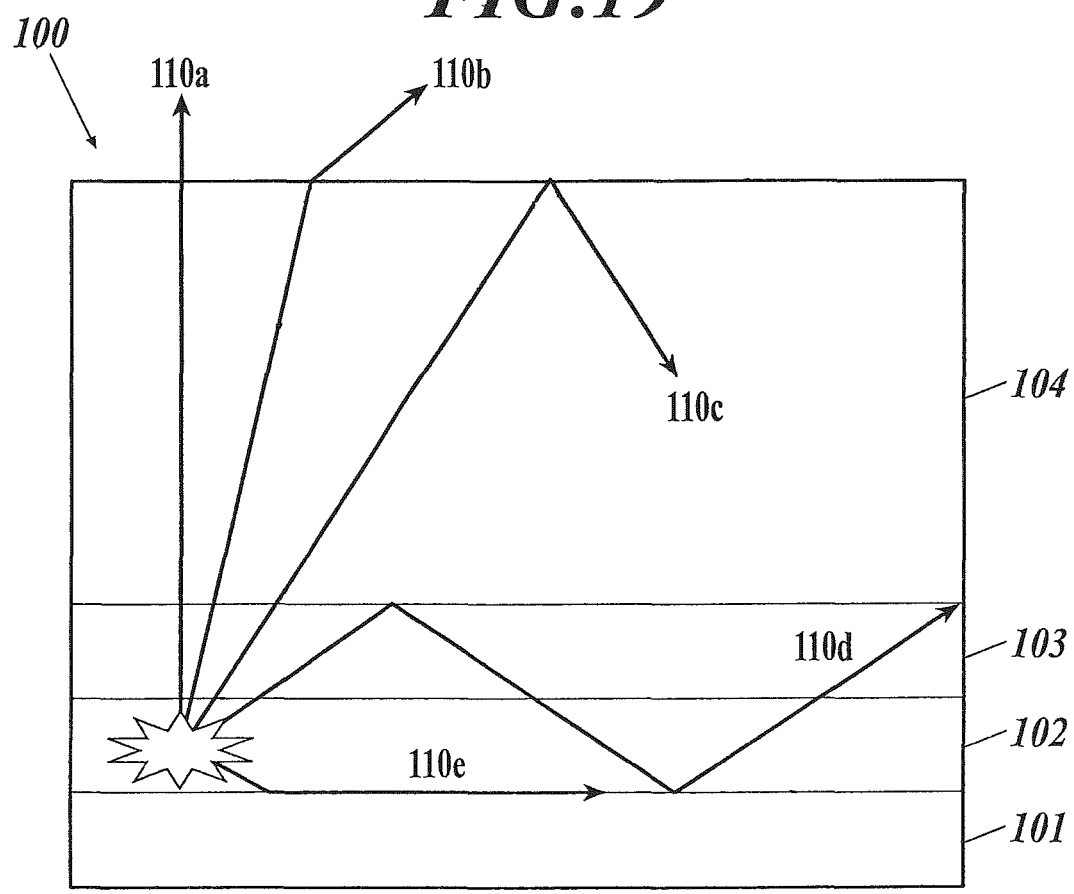
FIG. 19 is a sectional view schematically showing a configuration of a conventional organic light emitting element and propagation of light.

High wettability was rated as "GOOD (see FIG. 17)" and low wettability was rated as "No Good (see FIG. 18)".

TABLE 1

| Composition No. | | Average particle size of particles (μm) | Solvent (mass %) | | |
|---|---|---|---|---|---|
| A | Light scattering layer | 0.25 | n-Propyl acetate (10) | Cyclohexane (90) | — |
| | Smoothing layer | 0.02 | n-Propyl acetate (20) | Cyclohexane (30) | Toluene (50) |
| B | Light scattering layer | 0.25 | Hexylene glycol (30) | PGM (50) | IPA (20) |
| | Smoothing layer | 0.02 | Hexylene glycol (30) | PGM (50) | IPA (20) |

| | Composition No. | Dispersion Initial | Dispersion Restirred after 3 days | Ejection stability by ink jetting | Wettability |
|---|---|---|---|---|---|
| A | Light scattering layer | Good | Sedimented and/or aggregated | Good | No Good |
| | Smoothing layer | Good | Good | No Good | No Good |
| B | Light scattering layer | Good | Good | Good | Good |
| | Smoothing layer | Good | Good | Good | Good |

(2.4) Sample 3

Example: IR

A coated layer was dried with a wavelength control infrared heater (irradiation with infrared light) instead of a hot plate in the preparation of Sample 2. The infrared heater used was composed of an infrared heater made by Ushio Inc. (1000 W/color temperature: 2500 K) equipped with a quartz double-tube filter including an air cooling mechanism disposed therein in accordance to Japanese Patent No. 4790092 (see FIG. 13).

The distance between the sample and the infrared heater was 100 mm.

Sample 3 was prepared as in Sample 2 except for the conditions described above.

Samples 3-1 to 3-5 were prepared at different drying temperatures (filament temperature and filter temperature), proportions (%) of a spectral radiance at a wavelength of 5.8 μm to a spectral radiance at a wavelength of 3.0 μm, and drying times.

(2.5) Sample 4

Comparative Example: IR

A coated layer was dried with irradiating infrared light as in Sample 3 in place of a hot plate in preparation of Sample 1.

Sample 4 was prepared as in Sample 1 except for the conditions described above.

In Samples 3 and 4 involving a filament temperature set at 700 to 1500° C. with no filter, the proportion (%) of the spectral radiance at a wavelength of 5.8 μm to the spectral radiance at a wavelength of 3.0 μm was more than 5%, and the heat of radiation deformed the PET substrates as the transparent substrate. In such cases, no satisfactory organic light emitting element was produced.

(2.6) Samples 5 to 7

Examples: Irradiation with Light

A coated layer was dried through irradiation with infrared light as in preparation of Sample 3-3, and was irradiated with light.

Samples 5 to 7 were prepared as in Sample 3-3 except for the conditions described above. Samples 5-1 to 5-7, 6-1 to 6-7, and 7-1 to 7-7 were prepared by varying the target layer to be irradiated (one of the light scattering layer and the smoothing layer) and the irradiation process.

[Irradiation of Layer with Light (Apparatus and Conditions)]
P1: normal drying by radiative heat transfer with an infrared heater (IR applicator, Ultimate heater/carbon, made by Meimei Kogyo KK)

The distance between the sample and the infrared heater was 100 mm.

P2: metal halide lamp

The distance between the sample and the lamp was 100 mm.

P3: 172 nm Xe excimer, oxygen: 1000 ppm

The distance between the sample and the lamp was 2 mm.

P4: 172 nm Xe excimer, air

The distance between the sample and the lamp was 2 mm.

P5: 222 nm KrCl excimer, oxygen: 1000 ppm

The distance between the sample and the lamp was 20 mm.

P6: 222 nm KrCl excimer, air

The distance between the sample and the lamp was 20 mm.

P7: low energy EB made by Hamamatsu Photonics KK.

The distance between the sample and the lamp was 2 mm.

The process and conditions of preparing Samples 1 to 7 of the internal light extracting layer are shown in Tables 2 to 4.

Samples 3 to 7 were measured with an ellipsometer made by SOPRA SA. in accordance with D542. The entire internal light extracting layer had a refractive index of 1.85 at a wavelength of 550 nm.

TABLE 2

| | | Light scattering layer | | | | | | |
|---|---|---|---|---|---|---|---|---|
| | | | Drying | | | | | |
| Internal light extracting layer Sample No. | Composition | Application process | Method/apparatus | Temperature (° C.) HP | Filament | Filter | Proportion of spectral radiance (%) | Time (sec) |
| 0 | — | — | — | — | — | — | — | — |
| 1 | A | Spin coating | Hot plate | 120 | — | — | — | 3600 |
| 2 | B | Spin coating | Hot plate | 120 | — | — | — | 3600 |
| 3-1 | B | Spin coating | Irradiation with infrared light | — | 700 | 120 | 4.9 | 300 |
| 3-2 | | | | — | 1000 | 125 | 2.8 | 120 |
| 3-3 | | | | — | 1300 | 130 | 1.5 | 60 |
| 3-4 | | | | — | 1500 | 140 | 0.9 | 20 |
| 3-5 | | | | — | 1500 | 140 | 0.9 | 300 |
| 4 | A | Spin coating | Irradiation with infrared light | — | 1500 | 140 | 0.9 | 300 |

TABLE 3

| | | Smoothing layer | | | | | | |
|---|---|---|---|---|---|---|---|---|
| | | | Drying | | | | | |
| Internal light extracting layer Sample No. | Composition | Application process | Method/apparatus | Temperature (° C.) HP | Filament | Filter | Proportion of spectral radiance (%) | Time (sec) |
| 0 | — | — | — | — | — | — | — | — |
| 1 | A | Spin coating | Hot plate | 120 | — | — | — | 3600 |
| 2 | B | Spin coating | Hot plate | 120 | — | — | — | 3600 |
| 3-1 | B | Spin coating | Irradiation | — | 700 | 120 | 4.9 | 300 |

TABLE 3-continued

| Internal light extracting layer Sample No. | Smoothing layer | | | | | | |
|---|---|---|---|---|---|---|---|
| | Application | | Drying | | | | |
| | Composition | process | Method/apparatus | Temperature (° C.) | | Proportion of spectral radiance (%) | Time (sec) |
| | | | | HP Filament | Filter | | |
| 3-2 | | | with infrared light | 1000 125 | | 2.8 | 120 |
| 3-3 | | | | 1300 130 | | 1.5 | 60 |
| 3-4 | | | | 1500 140 | | 0.9 | 20 |
| 3-5 | | | | 1500 140 | | 0.9 | 300 |
| 4 | A | Spin coating | Irradiation with infrared light | — 1500 140 | | 0.9 | 300 |

TABLE 4

| Internal light extracting layer Sample No. | Light scattering layer | | | | Smoothing layer | | | |
|---|---|---|---|---|---|---|---|---|
| | Application and drying | Irradiation with light | | | Application and drying | Irradiation with light | | |
| | | Irradiation | Method | Energy (J/cm²) | | Irradiation | Method | Energy (J/cm²) |
| 5-1 | 3-3 | Done | P1 | 1.5 | 3-3 | | | — |
| 5-2 | | | P2 | | | | | |
| 5-3 | | | P3 | | | | | |
| 5-4 | | | P4 | | | | | |
| 5-5 | | | P5 | | | | | |
| 5-6 | | | P6 | | | | | |
| 5-7 | | | P7 | | | | | |
| 6-1 | 3-3 | | — | | 3-6 | Done | P1 | 1.5 |
| 6-2 | | | | | | | P2 | |
| 6-3 | | | | | | | P3 | |
| 6-4 | | | | | | | P4 | |
| 6-5 | | | | | | | P5 | |
| 6-6 | | | | | | | P6 | |
| 6-7 | | | | | | | P7 | |
| 7-1 | 3-3 | Done | P1 | 1.5 | 3-3 | Done | P1 | 1.5 |
| 7-2 | | | P2 | | | | P2 | |
| 7-3 | | | P3 | | | | P3 | |
| 7-4 | | | P4 | | | | P4 | |
| 7-5 | | | P5 | | | | P5 | |
| 7-6 | | | P6 | | | | P6 | |
| 7-7 | | | P7 | | | | P7 | |

The drying methods shown in Tables 2 and 3 are as follows:

Hot plate (HP): drying by conductive heat transfer with a hot plate (MH-180CS, made by AS ONE Corporation)

Irradiation with infrared light: drying by radiative heat transfer with a wavelength control infrared heater (infrared heater made by Ushio Inc. (1000 W/color temperature: 2500 K) equipped with a quartz double-tube filter including an air cooling mechanism disposed therein in accordance to Japanese Patent No. 4790092. See FIG. 13.)

In Tables 2 and 3, the HP temperature (° C.) indicates the heating temperature (setting temperature) of the hot plate.

In Tables 2 and 3, the filament temperature (° C.) was measured with a non-contact thermometer (IR-AHS, made by CHINO CORPORATION) at an emissivity of a tungsten filament of 0.39.

In Tables 2 and 3, the filter temperatures (° C.) were controlled to the temperatures listed in Tables 2 and 3 through measurement of the surface temperature of the quartz filter with a contact thermometer (HFT-60, made by Anritsu Meter Co., Ltd.) and adjustment of the flow rate of the cooling air.

In Tables 2 and 3, the "Proportion (%) of spectral radiance", i.e., the proportion of the wavelength 5.8 μm to the spectral radiance at the wavelength of 3.0 μm was determined by the following procedure.

The temperature of the standard black furnace (M390, made by Mikron Instrument Co. Inc.) was adjusted to the measured filament temperature of the infrared heater. The radiation outputs of the standard black furnace and the infrared heater were measured with an FT-IR spectrometer (FT/IR-4100, made by JASCO Corporation) at a wavenumber of 7800 to 350 cm$^{-1}$, a resolution of 4 cm$^{-1}$, and the number of accumulations of 32 to determine the spectral emissivity of the infrared heater.

The radiation spectrum from the black furnace at the same temperature as that of the standard black furnace was calculated according to Planck's law of radiation, and was multiplied by the spectral emissivity of the infrared heater to obtain the spectral emission spectrum of the infrared heater.

From the spectral emission spectrum of the infrared heater, the spectral radiance at a wavelength of 3.0 μm and the spectral radiance at a wavelength of 5.8 μm were read, and the proportion (percentage) of the spectral radiance at a wavelength of 5.8 μm to the spectral radiance at a wavelength of 3.0 μm were determined by calculation.

(3) EVALUATION OF INTERNAL LIGHT EXTRACTING LAYER

(3.1) Examination by Touch

The surface of the internal light extracting layer was examined by touch, and was evaluated on the following criteria.

The results are shown in Table 5 below.

Good: a smooth, non-sticky surface

No Good: a sticky surface due to residual solvent.

(3.2) Determination of Haze Value

The haze value (%) was determined with a HAZE METER ER NDH5000 made by Tokyo Denshoku Co., Ltd. in accordance with JIS K 7361-1:1997.

The results are shown in Table 5 below.

(3.3) Determination of Light Absorbance

A spectrophotometer U3300 made by Hitachi Instruments Service Co., Ltd. equipped with an integrating sphere unit U3310 (diameter: 150 mm) was used to measure the transmittance and the reflectance of an internal light extracting layer, and determine the absorbance (maximum value (max) and the minimum value (min)) (%) of the internal light extracting layer at a wavelength ranging from 450 to 700 nm.

The determined absorbances are shown in Table 5.

Preparation of Samples of Organic Light Emitting Element

(1) PREPARATION OF TRANSPARENT METAL ELECTRODE

A PET substrate having an internal light extracting layer disposed thereon was fixed with a substrate holder of a commercially available vacuum deposition apparatus. Exemplary compound 10 was placed in a tantalum resistive heating boat. The substrate holder and the heating boat were mounted on a first vacuum chamber of the vacuum deposition apparatus. Silver (Ag) was placed in another tungsten resistive heating boat, and was mounted on a second vacuum chamber.

In this state, the pressure of the first vacuum chamber was reduced to $4\times10^{-4}$ Pa, and the heating boat containing Exemplary compound 10 was heated by electrical conduction to deposit an undercoat layer of Exemplary compound 10 (thickness: 25 nm) on the substrate (smoothing layer) at a deposition rate of 0.1 to 0.2 nm/sec.

The substrate having the undercoat layer deposited thereon was placed into the second vacuum chamber under vacuum. The pressure of the second vacuum chamber was reduced to $4\times10^{-4}$ Pa, and the heating boat containing silver was heated by electrical conduction to deposit an electrode layer composed of silver (thickness: 8 nm) on the substrate (undercoat layer) at a deposition rate of 0.1 to 0.2 nm/sec. A transparent metal electrode having a laminate structure composed of the undercoat layer and the electrode layer was prepared.

[Formula 3]

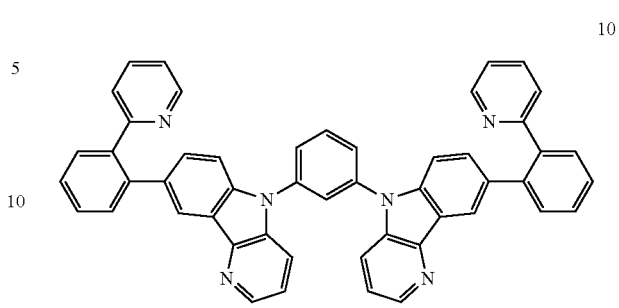

10

(2) DEPOSITION OF LUMINOUS FUNCTIONAL LAYER

The transparent substrate provided with the internal light extracting layer and the transparent metal electrode deposited thereon was overlaid with a mask having an opening (30 mm×30 mm) in the center, and was fixed to a substrate holder of a commercially available vacuum deposition chamber. The materials for luminous functional layers were placed on respective heating boats inside the vacuum deposition apparatus. The amounts of the respective materials were optimized to form the corresponding luminous functional layers.

The heating boats used were composed of a tungsten material for resistive heating.

The inner pressure of the deposition chamber of the vacuum deposition apparatus was reduced to a degree of vacuum of $4\times10^{-4}$ Pa, and the respective heating boats containing the materials were sequentially heated by electrical conduction to deposit the respective layers as follows.

The heating boat containing a hole transporting injecting material α-NPD represented by a structural formula shown below was heated by electrical conduction to deposit a hole transporting injecting layer composed of α-NPD on the electrode layer forming the transparent metal electrode. The hole transporting injecting layer served as a hole injecting layer and a hole transporting layer. The deposition rate was 0.1 to 0.2 nm/sec, and the thickness was 140 nm.

[Formula 4]

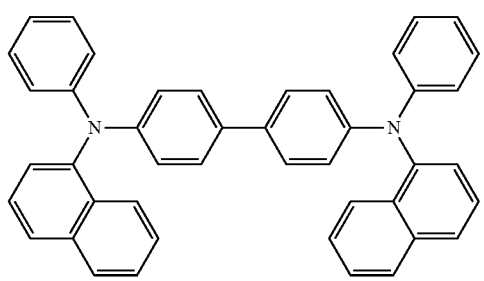

α-NPD

Next, a heating boat containing Host material H4 represented by a structural formula shown below and another heating boat containing Phosphorescence luminous compound Ir-4 represented by a structural formula shown below were each independently electrically conducted to deposit a luminous layer composed of Host material H4 and Phosphorescence luminous compound Ir-4 on the hole transporting injecting layer. The electrical conduction of the heating boats was controlled such that the ratio of the deposition rates was Host material H4:Phosphorescence luminous compound Ir-4=100:6. The thickness was 30 nm.

A heating boat containing a hole blocking material BAlq represented by the following structural formula was then heated by electrical conduction to deposit a hole blocking layer composed of BAlq on the luminous layer. The deposition rate was 0.1 to 0.2 nm/sec, and the thickness was 10 nm.

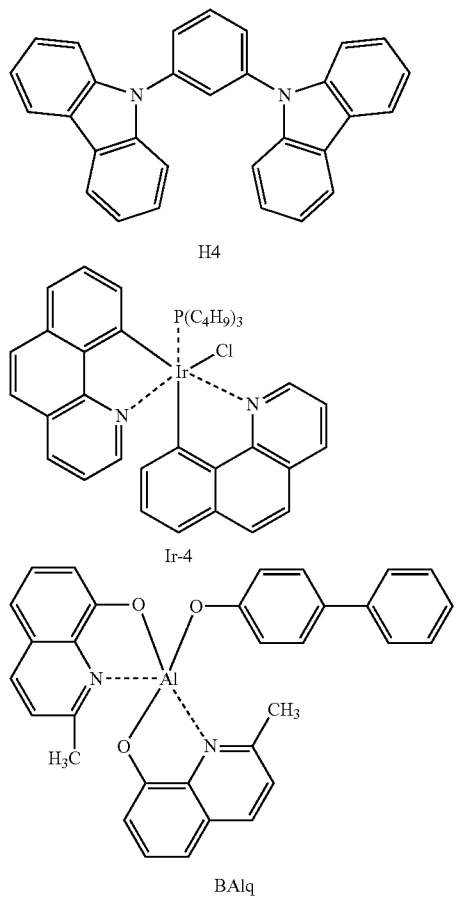

[Formula 5]

H4

Ir-4

BAlq

In the subsequent step, the heating boat containing the electron transport material Exemplary compound 10 listed above and a heating boat containing potassium fluoride were each independently electrically conducted to deposit an electron transporting layer composed of Exemplary compound 10 and potassium fluoride on the hole blocking layer. The electrical conduction of the heating boats was controlled such that the ratio of the deposition rates was Exemplary compound 10:potassium fluoride=75:25. The thickness was 30 nm.

Another heating boat containing an electron injecting material potassium fluoride was heated by electrical conduction to deposit an electron injecting layer composed of potassium fluoride on the electron transporting layer. The deposition rate was 0.01 to 0.02 nm/sec, and the thickness was 1 nm.

(3) FORMATION OF COUNTER ELECTRODE AND SEALING

The transparent substrate provided with the electron injecting layer deposited thereon was transferred into the second vacuum chamber under vacuum. The second vacuum chamber was equipped with a tungsten resistive heating boat containing aluminum (Al). The workpiece was overlaid with a mask having an opening (20 mm×50 mm) The mask was disposed perpendicular to the anode. A reflective counter electrode or cathode was formed of Al inside the vacuum chamber at a film forming rate of 0.3 to 0.5 nm/sec. The counter electrode had a thickness of 100 nm.

The resulting organic light emitting element was then covered with a sealing material, which was a glass substrate having a dimension of 40 mm×40 mm and a thickness of 700 μm and having a recess (34 mm×34 mm, depth: 350 μm) in the central portion thereof. The gap between the sealing material and the transparent substrate was filled with an adhesive (seal) in the state when the organic light emitting element was surrounded by the glass substrate. The adhesive used was an epoxy photo-curable adhesive (Laxtrack LC0629B made by TOAGOSEI CO., LTD.).

The adhesive injected between the sealing material and the transparent substrate was irradiated with UV light through the glass substrate (sealing material) to cure the adhesive. The organic light emitting element was encapsulated.

In the formation of the organic light emitting element, the respective layers were deposited through deposition masks to define Luminous region A (2.0 cm×2.0 cm) in the central portion of the transparent substrate (5 cm×5 cm) and Non-luminous region B (width: 1.5 cm) around Luminous region A.

The transparent metal electrode as the anode was insulated from the counter electrode or cathode with the luminous functional layer from the hole transporting injecting layer to the electron transporting layer, and the terminals of these electrodes were drawn to the periphery of the transparent substrate.

Samples 0, 10, 20, 31 to 35, 40, 51 to 57, 61 to 67, and 71 to 77 of the organic light emitting elements were prepared corresponding to the samples of the internal light extracting layers.

Evaluation on Samples of Organic Light Emitting Elements (1) MEASUREMENT OF STARTING VOLTAGE AND LUMINESCENCE EFFICIENCY The respective samples were activated at room temperature (within the range of about 23 to 25° C.) at a constant current density of 2.5 mA/cm$^2$. The luminance of the light emitted from each sample was measured with a spectral radiance meter CS-2000 (made by KONICA MINOLTA OPTICS, INC.) to determine the luminescence efficiency (outcoupling efficiency) at the current value.

The results are shown in Table 5.

The luminescence efficiency is expressed as a relative value to the luminescence efficiency (100) of Sample 0 of the organic light emitting element (reference: organic light emitting element having no internal light extracting layer).

(2) EVALUATION ON STORAGE CHARACTERISTICS

The fluctuation in luminance was measured before and after each sample was placed in an 85° C. thermostatic chamber. In the measurement, the luminance was tracked at a current value corresponding to 1000 cd before the sample was placed in the thermostatic chamber, and the time until Δ 5% variation in the luminance was confirmed.

The results are shown in Table 5.

(3) EVALUATION ON UV WEATHERABILITY

A dark spot (non-luminous portion) area rate was measured before and after a sample was placed in a sunshine weather meter (S80HB made by Suga Test Instruments Co., Ltd.) at an irradiance of 255 W/m² (300 to 700 nm) for 48 hours. In the measurement, the current density was 2.5 mA/dm².

The dark spot area rate (%) refers to the ratio of the area of the non-luminous portion to the area of the luminous portion.

The results are shown in Table 5.

It should be noted that an object of the present invention is to provide a roll-to-roll (RtoR) process enabling mass production of organic light emitting elements. In this respect, the conventional drying process with a hot plate has low ability to dry. A composition dried by this process does not attain the stability over time of the pattern, and a composition attaining the stability over time of the pattern is not dried by this process. In contrast, the present inventor has found that in the present invention, a combination of a wavelength-controlled IR drying process with a composition attaining the stability of the pattern over time can not only attain a light extraction structure mass-productable by a low temperature process using film substrates, but also improve the absorption, the scratch resistance, the heat resistance, and the UV durability of the layers in the light extraction structure, and has achieved the present invention.

TABLE 5

| Organic light emitting element Sample No. | Sample No. | Internal light extracting layer | | | | | | Durability |
|---|---|---|---|---|---|---|---|---|
| | | Examination by touch | Haze (%) | Absorptivity (%) max | Absorptivity (%) min | *1 | *2 | UV weatherability (%) |
| 0 | 0 | — | 0.2 | — | — | 100 | — | — |
| 10 | 1 | Good | 50 | 17 | 8 | 130 | 24 | 10 |
| 20 | 2 | No Good | — | — | — | — | — | — |
| 31 | 3-1 | Good | 55 | 13 | 8 | 135 | 72 | 2 |
| 32 | 3-2 | | | 13 | | 140 | 72 | 1.50 |
| 33 | 3-3 | | | 12 | | 145 | 72 | 1.50 |
| 34 | 3-4 | | | 13 | | 145 | 72 | 1.50 |
| 35 | 3-5 | | | 13 | | 145 | 96 | 1 |
| 40 | 4 | No Good | — | — | — | — | — | — |
| 51 | 5-1 | Good | 55 | 12 | 8 | 140 | 72 | 1.50 |
| 52 | 5-2 | | | | | 145 | 72 | 1.50 |
| 53 | 5-3 | | | | | 145 | 72 | 1 |
| 54 | 5-4 | | | | | 145 | 72 | 1 |
| 55 | 5-5 | | | | | 145 | 72 | 1 |
| 56 | 5-6 | | | | | 145 | 72 | 1 |
| 57 | 5-7 | | | | | 145 | 72 | 1 |
| 61 | 6-1 | Good | 55 | 12 | 8 | 140 | 72 | 1 |
| 62 | 6-2 | | | | | 150 | 96 | 0.75 |
| 63 | 6-3 | | | | | 155 | 120 | 0.50 |
| 64 | 6-4 | | | | | 155 | 120 | 0.50 |
| 65 | 6-5 | | | | | 155 | 120 | 0.50 |
| 66 | 6-6 | | | | | 155 | 120 | 0.50 |
| 67 | 6-7 | | | | | 150 | 96 | 0.75 |
| 71 | 7-1 | Good | 55 | 12 | 8 | 140 | 72 | 1 |
| 72 | 7-2 | | | | | 150 | 96 | 0.75 |
| 73 | 7-3 | | | | | 155 | 120 | 0.50 |
| 74 | 7-4 | | | | | 155 | 120 | 0.50 |
| 75 | 7-5 | | | | | 155 | 120 | 0.50 |
| 76 | 7-6 | | | | | 155 | 120 | 0.50 |
| 77 | 7-7 | | | | | 150 | 96 | 0.75 |

*1: Luminescence efficiency
*2: Storage characteristics(hr)

(4) CONCLUSION

Table 5 evidently shows that the results of Samples 31 to 35, 51 to 57, 61 to 67, and 71 to 77 of the organic light emitting elements are better than those of Samples 0, 10, 20, and 40.

These results indicate that the luminescence efficiency and the durability of the organic light emitting element are effectively enhanced through application of a coating solution composed of a predetermined light scattering particle dispersed in a hydroxy-containing solvent onto a transparent substrate and drying of the coating solution through irradiation with infrared light.

INDUSTRIAL APPLICABILITY

The present invention can be particularly suitably used in mass production of organic light emitting elements having enhanced luminescence efficiency and durability.

The invention claimed is:

1. A method of manufacturing an organic light emitting element including a transparent substrate, an internal light extracting layer, and a transparent metal electrode, the method comprising:
   forming the internal light extracting layer on the transparent substrate, and forming the transparent metal electrode on the internal light extracting layer, wherein the step of forming the internal light extracting layer includes:

applying a coating solution onto the transparent substrate into a predetermined pattern, the coating solution containing a light scattering particle having an average particle size of 0.2 µm or more and less than 1 µm and a refractive index of 1.7 or more and less than 3.0 and a hydroxy-containing solvent, and drying the applied patterned coating solution through irradiation with infrared light having a proportion of 5% or less of a spectral radiance at a wavelength of 5.8 µm to a spectral radiance at a wavelength of 3.0 µm.

2. The method of manufacturing the organic light emitting element of claim 1, wherein the step of forming the internal light extracting layer includes irradiating the dried coating solution with ultraviolet light or an electron beam to cure the dried coating solution.

3. The method of manufacturing the organic light emitting element of claim 2, wherein in the step of curing the coating solution, the ultraviolet light is excimer light having a wavelength of 150 nm to 230 nm.

4. The method of manufacturing the organic light emitting element of claim 1, wherein in the step of applying the coating solution into the predetermined pattern, the coating solution is applied into the predetermined pattern by an inkjet process.

5. The method of manufacturing the organic light emitting element of claim 1, further comprising:

forming an organic functional layer on the transparent metal electrode, wherein in the step of forming the organic functional layer, the organic functional layer is formed in a position to overlap with the internal light extracting layer in plan view.

6. The method of manufacturing the organic light emitting element of claim 1, wherein in the step of forming the internal light extracting layer, the internal light extracting layer is formed on the transparent substrate by a roll-to-roll process in a midway between a feed roll and a take-up roll while the transparent substrate unwound from the feed roll is being wound around the take-up roll.

* * * * *